US010374044B2

(12) United States Patent
Iijima et al.

(10) Patent No.: US 10,374,044 B2
(45) Date of Patent: Aug. 6, 2019

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Ryosuke Iijima, Setagaya (JP); Shinya Kyogoku, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/059,235

(22) Filed: Aug. 9, 2018

(65) Prior Publication Data

US 2019/0198619 A1 Jun. 27, 2019

(30) Foreign Application Priority Data

Dec. 21, 2017 (JP) ................................ 2017-244584

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02529* (2013.01); *H01L 21/045* (2013.01);
(Continued)

(58) Field of Classification Search
CPC ........... H01L 29/1608; H01L 29/66068; H01L 29/086; H01L 29/7813; H01L 29/66734;
(Continued)

(56) References Cited

U.S. PATENT DOCUMENTS

2014/0145206 A1 5/2014 Siemieniec et al.
2015/0340487 A1 11/2015 Siemieniec et al.
(Continued)

FOREIGN PATENT DOCUMENTS

JP 2014-107571 6/2014
JP 2015-226060 12/2015
(Continued)

OTHER PUBLICATIONS

U.S. Appl. No. 15/905,886, filed Feb. 27, 2018, Shinya Kyogoku et al.

*Primary Examiner* — Anthony Ho
(74) *Attorney, Agent, or Firm* — Oblon, McClelland, Maier & Neustadt, L.L.P.

(57) ABSTRACT

A semiconductor device of an embodiment includes a silicon carbide layer having a first plane and a second plane; a trench having a first side face, a second side face, and a bottom face; a first silicon carbide region of a first conductivity type; a second silicon carbide region and a third silicon carbide region of a second conductivity type, the third silicon carbide region and the second silicon carbide region sandwiching the trench; a sixth silicon carbide region of a second conductivity type in contact with the second side face and the bottom face; and a gate electrode in the trench. The first side face has a first region having a first inclination angle. The off angle of the first region with respect to a {0-33-8} face is no more than 2 degrees. A second inclination angle of the second side face is larger the first inclination angle.

10 Claims, 22 Drawing Sheets

SECOND DIRECTION
100
30a 18a 20a 30b 18b 20b
12
P1
$n^+$ $n^+$ $n^+$
16a 51a 52 p 16b 61a 62 p
p 28c
51 28a 28b 61
$p^+$ $p^+$ $p^+$
10 50 60
53 32a 63 32b
$n^-$ 26
$n^+$ 24
P2
14

(51) Int. Cl.

| | |
|---|---|
| ***H01L 21/04*** | (2006.01) |
| ***H01L 29/10*** | (2006.01) |
| ***H01L 29/08*** | (2006.01) |
| ***H01L 29/66*** | (2006.01) |
| ***H01L 29/78*** | (2006.01) |

(52) U.S. Cl.
CPC ........ *H01L 29/086* (2013.01); *H01L 29/0878* (2013.01); *H01L 29/1095* (2013.01); *H01L 29/66068* (2013.01); *H01L 29/66734* (2013.01); *H01L 29/7813* (2013.01)

(58) Field of Classification Search
CPC ........... H01L 21/02529; H01L 29/1095; H01L 21/045; H01L 29/0878
See application file for complete search history.

(56) References Cited

U.S. PATENT DOCUMENTS

| | | | |
|---|---|---|---|
| 2016/0163852 | A1 | 6/2016 | Siemieniec et al. |
| 2016/0172468 | A1 | 6/2016 | Esteve et al. |

FOREIGN PATENT DOCUMENTS

| | | |
|---|---|---|
| JP | 5907940 | 4/2016 |
| JP | 2016-115936 | 6/2016 |
| JP | 2016-122835 | 7/2016 |

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-244584, filed on Dec. 21, 2017, the entire contents of which are incorporated herein by reference.

FIELD

Embodiments described herein relate generally to a semiconductor device, an inverter circuit, a driving device, a vehicle, and an elevator.

BACKGROUND

Silicon carbide is expected as a material for next generation semiconductor devices. Compared to silicon, silicon carbide has superior physical properties such as a band gap of approximately 3 times, a breakdown field strength of approximately 10 times, and a thermal conductivity of approximately 3 times. By utilizing these physical properties, it is possible to realize a semiconductor device capable of operating with low loss and high temperature.

As a structure for reducing the on-resistance of a metal oxide semiconductor field effect transistor (MOSFET) using silicon carbide, there is a trench gate type MOSFET in which a gate electrode is provided in a trench. In a trench gate type MOSFET, the on-resistance is reduced, since the channel density per unit area is increased. In a trench gate type MOSFET, it is further expected to realize a structure for reducing the on-resistance.

DETAILED DESCRIPTION

Figure 1:
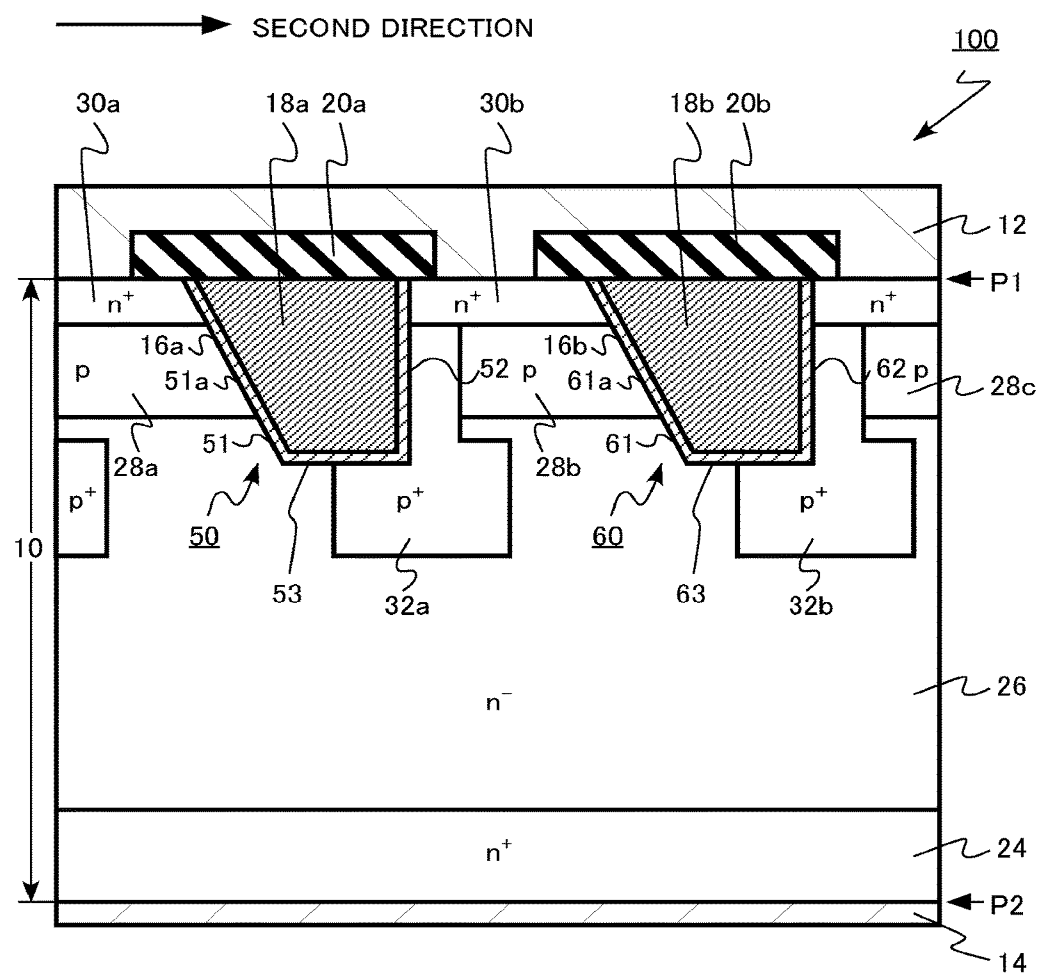
FIG. 1 is a schematic sectional view of a semiconductor device of the first embodiment.

A semiconductor device of an embodiment is provided with: a silicon carbide layer having a first plane and a second plane, the silicon carbide layer having an off angle of the first plane of no more than 8 degrees with respect to a (000-1) face; a first electrode located on a side of the first plane of the silicon carbide layer; a second electrode located on a side of the second plane of the silicon carbide layer; a trench existing in the silicon carbide layer, the trench having a first side face, a second side face, and a bottom face between the first side face and the second side face; a first silicon carbide region of a first conductivity type located in the silicon carbide layer and in contact with the first side face; a second silicon carbide region of a second conductivity type located in the silicon carbide layer, the second silicon carbide region located between the first silicon carbide region and the first plane, and the second silicon carbide region being in contact with the first side face; a third silicon carbide region of a second conductivity type located in the silicon carbide layer, the third silicon carbide region located between the first silicon carbide region and the first plane, the trench is located between the third silicon carbide region and the second silicon carbide region; a fourth silicon carbide region of a first conductivity type located in the silicon carbide layer, the fourth silicon carbide region located between the second silicon carbide region and the first plane, and the fourth silicon carbide region being in contact with the first side face; a fifth silicon carbide region of a first conductivity type located in the silicon carbide layer, and the fifth silicon carbide region located between the third silicon carbide region and the first plane, the trench is located between the fifth silicon carbide region and the fourth silicon carbide region; a sixth silicon carbide region of a second conductivity type located in the silicon carbide layer and the sixth silicon carbide region being in contact with the second side face and the bottom face; a gate electrode located between the first side face and the second side face; and a gate insulating layer located between the gate electrode and the second silicon carbide region, wherein the first side face has a first region that is in contact with the second silicon carbide region and has a first inclination angle with respect to the first plane, an off angle of the first region with respect to a {0-33-8} face is no more than 2 degrees, and a second inclination angle of the second side face with respect to the first plane is larger than the first inclination angle.

The following description will explain some embodiments of the present disclosure with reference to the drawings. In the following description, it is to be noted that the same or similar members or the like are denoted by the same reference numerals, and explanation of members or the like once described will be omitted as appropriate.

In the following description, the notations $n^+$, n, and $n^-$, and $p^+$, p, and $p^-$ represent the relative height of impurity concentration of each conductivity type. That is, $n^+$ indicates an impurity concentration of n type relatively higher than n, and $n^-$ indicates an impurity concentration of n type relatively lower than n. Moreover, $p^+$ indicates an impurity concentration of p type relatively higher than p, and $p^-$ indicates an impurity concentration of p type relatively lower than p. It is to be noted that type and $n^-$ type are sometimes described simply as n type, and $p^+$ type and $p^-$ type are sometimes described simply as p type.

Impurity concentration can be measured by secondary ion mass spectrometry (SIMS), for example. Moreover, the relative height of impurity concentration can also be judged from the height of carrier concentration obtained by scanning capacitance microscopy (SCM), for example. Moreover, distance such as the depth of an impurity region can be obtained by SIMS, for example. Moreover, distance such as the width or the depth of an impurity region can be obtained from an SCM image, for example.

The shape of a trench, the thickness of an insulating layer, and the like can be measured on a transmission electron microscope (TEM) image, for example.

The orientation or the like of the first plane or a side face of a trench can be identified by, for example, imaging the atomic arrangement directly with a high-resolution TEM.

In notation of crystal faces, for example, a face equivalent to a (0-33-8) face is expressed as a {0-33-8} face. For example, a (−303-8) face and a (−330-8) face are included in the {0-33-8} face.

In the present specification, "off angle" means an angle between a reference plane and a plane to be compared.

First Embodiment

A semiconductor device of the first embodiment is provided with: a silicon carbide layer having a first plane and a second plane, the silicon carbide layer having an off angle of the first plane of no more than 8 degrees with respect to a (000-1) face; a first electrode located on the side of the first plane of the silicon carbide layer; a second electrode located on the side of the second plane of the silicon carbide layer; a trench existing in the silicon carbide layer, the trench having a first side face, a second side face, and a bottom face between the first side face and the second side face; a first silicon carbide region of a first conductivity type located in the silicon carbide layer and in contact with the first side face; a second silicon carbide region of a second conductivity type located in the silicon carbide layer, between the first silicon carbide region and the first plane, and in contact with the first side face; a third silicon carbide region of a second conductivity type located in the silicon carbide layer and between the first silicon carbide region and the first plane, the third silicon carbide region and the second silicon carbide region sandwiching the trench; a fourth silicon carbide region of a first conductivity type located in the silicon carbide layer, between the second silicon carbide region and the first plane, and in contact with the first side face; a fifth silicon carbide region of a first conductivity type located in the silicon carbide layer and between the third silicon carbide region and the first plane, the fifth silicon carbide region and the fourth silicon carbide region sandwiching the trench; a sixth silicon carbide region of a second conductivity type located in the silicon carbide layer and in contact with the second side face and the bottom face; a gate electrode located between the first side face and the second side face; and a gate insulating layer located between the gate electrode and the second silicon carbide region. The first side face has a first region that is in contact with the second silicon carbide region and has a first inclination angle with respect to the first plane. The off angle of the first region with respect to a {0-33-8} face is no more than 2 degrees. A second inclination angle of the second side face with respect to the first plane is larger the first inclination angle.

FIG. 1 is a schematic sectional view of a semiconductor device of the first embodiment. The semiconductor device of the first embodiment is a trench gate type vertical MOSFET 100 using silicon carbide. In the first embodiment, the first conductivity type is n type, and the second conductivity type is p type. The MOSFET 100 is an n-channel MOSFET using electrons as carriers.

Figure 2:
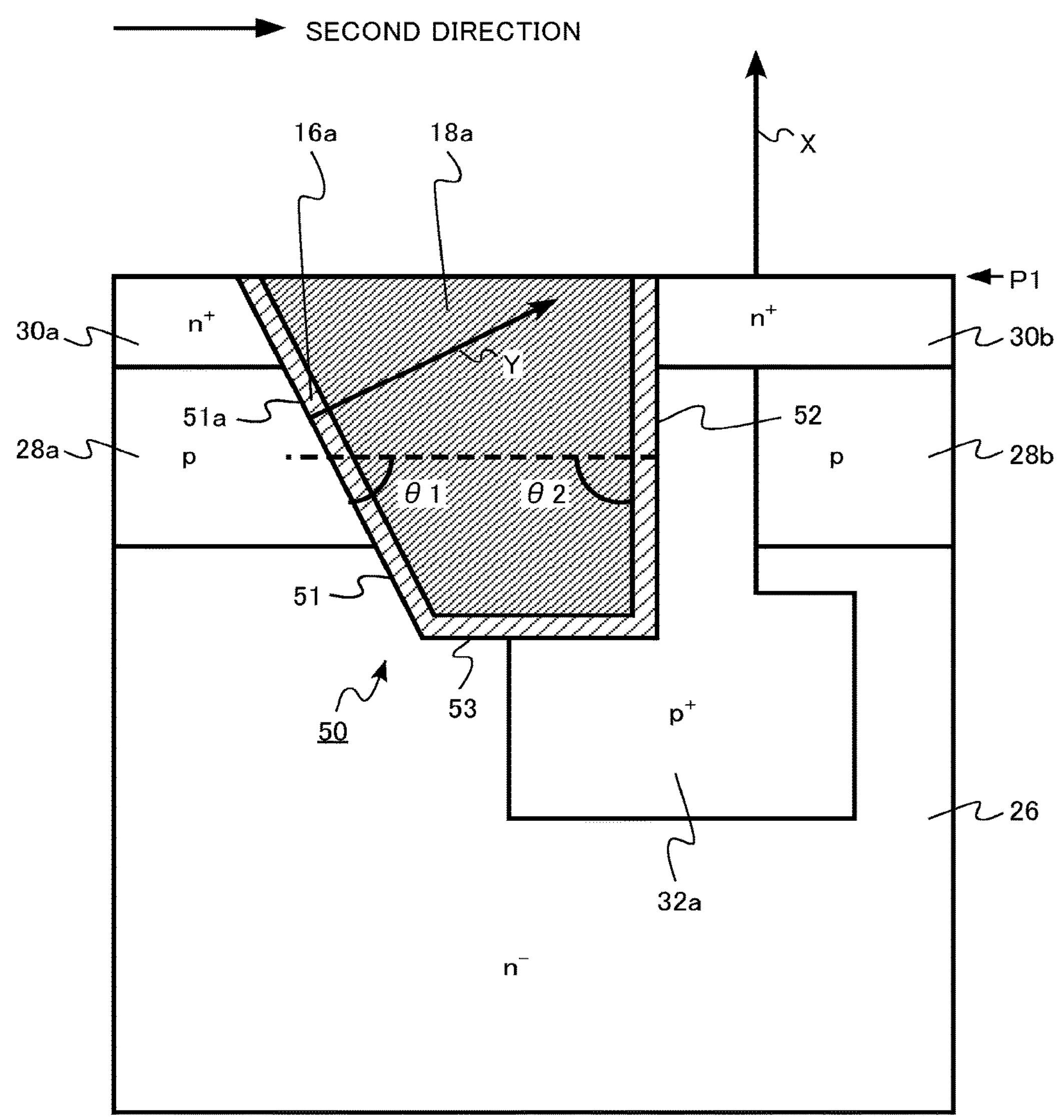
FIG. 2 is an enlarged schematic sectional view of a semiconductor device of the first embodiment.

FIG. 2 is an enlarged schematic sectional view of a semiconductor device of the first embodiment. FIG. 2 is a view illustrating a unit cell of the MOSFET 100. In the MOSFET 100, unit cells illustrated in FIG. 2 are repeatedly disposed in the second direction at a predetermined pitch.

Figure 3:
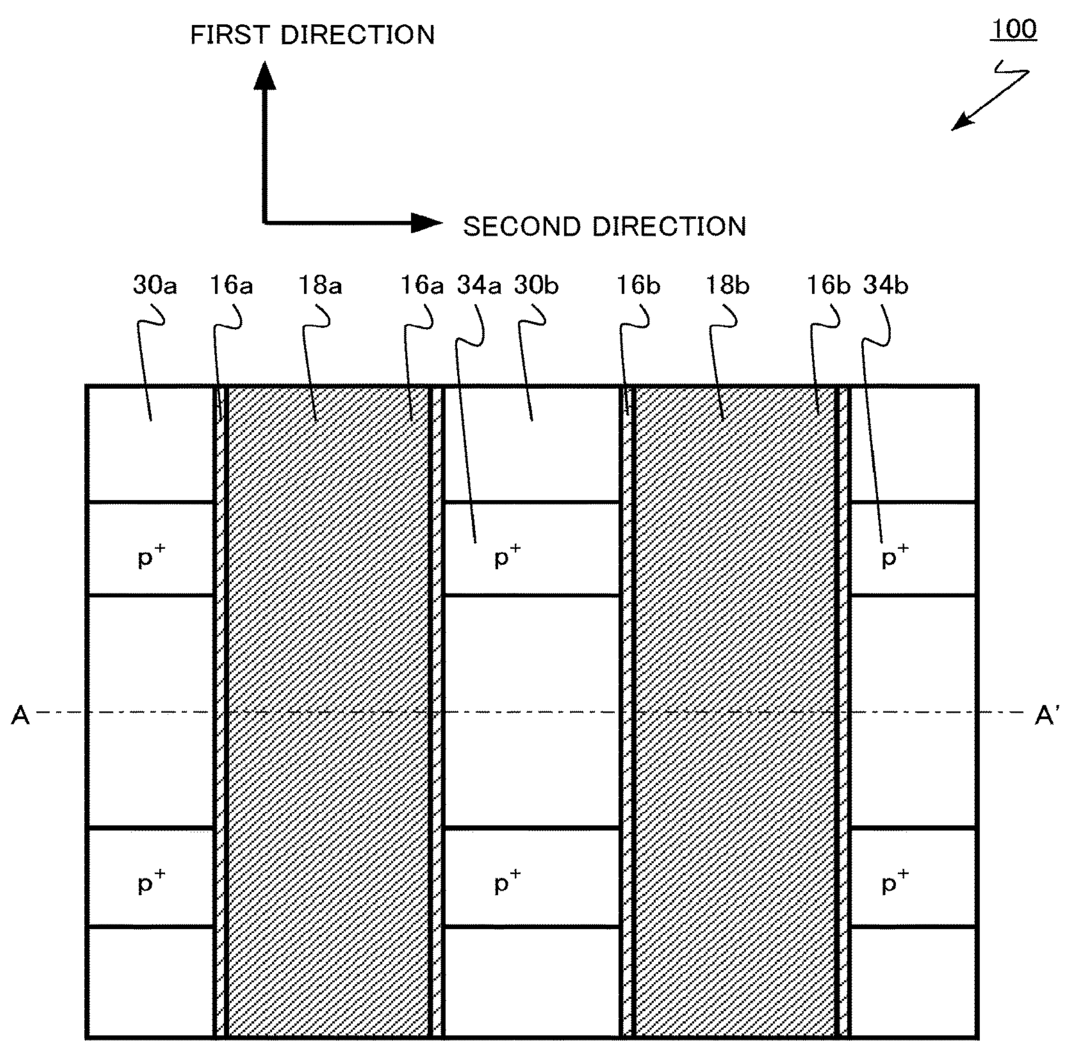
FIG. 3 is a schematic plan view of a semiconductor device of the first embodiment.

FIG. 3 is a schematic plan view of a semiconductor device of the first embodiment. FIG. 3 is a plan view along the first plane (P1 in FIG. 1) of FIG. 1. FIGS. 1 and 2 are cross sections taken along line AA' of FIG. 3.

It is to be noted that the first direction and the second direction are parallel to the first plane P1 of the MOSFET 100. Moreover, the second direction is orthogonal to the first direction.

The MOSFET 100 is provided with a silicon carbide layer 10, a source electrode 12 (first electrode), a drain electrode 14 (second electrode), a first gate insulating layer **16*a* (gate insulating layer), a second gate insulating layer 16*b*, a first gate electrode 18*a* (gate electrode), a second gate electrode 18*b*, a first interlayer insulating layer 20*a*, a second interlayer insulating layer 20*b*, a first trench 50 (trench), and a second trench 60**.

Provided in the silicon carbide layer 10 are an $n^+$-type drain region 24 (seventh silicon carbide region), an $n^-$-type drift region 26 (first silicon carbide region), a p-type first body region **28*a* (second silicon carbide region), a p-type second body region 28*b* (third silicon carbide region), a p-type third body region 28*c*, an $n^+$-type first source region 30*a* (fourth silicon carbide region), an $n^+$-type second source region 30*b* (fifth silicon carbide region), a $p^+$-type first electric field relaxation region 32*a* (sixth silicon carbide region), a $p^+$-type second electric field relaxation region 32*b*, a $p^+$-type first contact region 34*a*, and a $p^+$-type second contact region 34*b***.

The silicon carbide layer 10 is single crystal SiC. The silicon carbide layer 10 is, for example, 4H—SiC.

Figure 4:
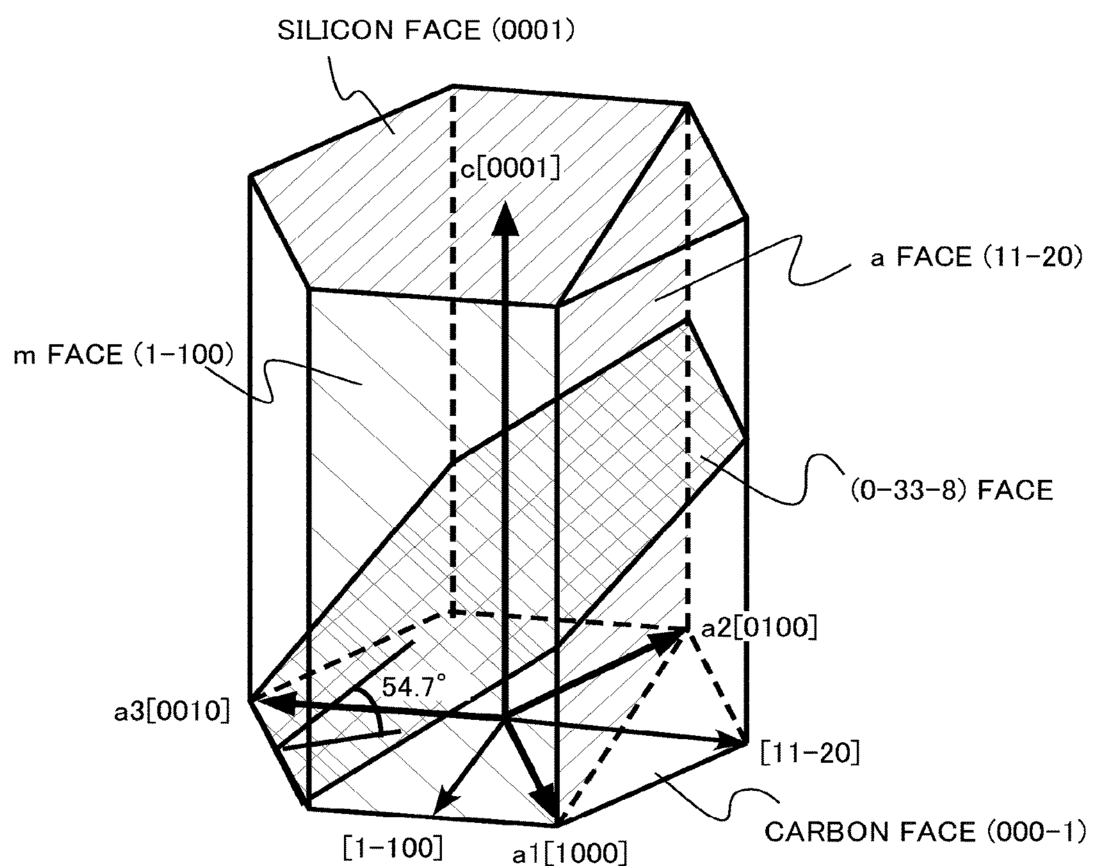
FIG. 4 is an explanatory diagram of the crystal structure of an SiC semiconductor.

FIG. 4 is an explanatory diagram of the crystal structure of an SiC semiconductor. A representative crystal structure of an SiC semiconductor is a hexagonal crystal system such as 4H—SiC. One of faces (top face of hexagonal prism) having a c axis along the axial direction of the hexagonal prism as a normal line is a (0001) face. A (0001) face is also referred to as a silicon face (Si face). Si (silicon) is arranged on the outermost face of the silicon face.

The other of faces (top face of hexagonal prism) having a c axis along the axial direction of the hexagonal prism as a normal line is a (000-1) face. A (000-1) face is also referred to as a carbon face (C face). C (carbon) is arranged on the outermost face of the carbon face.

On the other hand, a side face (prismatic plane) of the hexagonal prism is an m face which is a face equivalent to a (1-100) face, that is, a {1-100} face. Moreover, a plane passing through a pair of ridgelines not adjacent to each other is an a face which is a face equivalent to a (11-20) face, that is, a {11-20} face. Both of Si (silicon) and C (carbon) are arranged on the m face and the a face.

FIG. 4 also illustrates the position of a (0-33-8) face. The angle between the (0-33-8) face and the carbon face is 54.7 degrees. The (0-33-8) face is included in a {0-33-8} face.

The silicon carbide layer 10 is provided with a first plane ("P1" in FIG. 1) and a second plane ("P2" in FIG. 1). Hereinafter, the first plane P1 is also referred to as a front face, and the second plane P2 is also referred to as a back face. Hereinafter, it is to be noted that "depth" means a depth with reference to the first plane P1.

The first plane P1 is a plane inclined by 0 degree to 8 degrees with respect to the (000-1) face. That is, the first plane P1 is a plane having a normal line (X in FIG. 2) inclined by 0 degree to 8 degrees with respect to the c axis in the [000-1] direction. In other words, the first plane P1 has an off angle of 0 degree to 8 degrees with respect to the (000-1) face, that is, the carbon face.

Moreover, the second plane P2 is a plane inclined by 0 degree to 8 degrees with respect to the (0001) face. In other words, the second plane P2 has an off angle of 0 degree to 8 degrees with respect to the (0001) face, that is, the silicon face.

The first trench 50 and the second trench 60 exist in the silicon carbide layer 10. The first trench 50 and the second trench 60 extend in the first direction. The first trench 50 and the second trench 60 are part of the silicon carbide layer 10.

The first trench 50 has a first side face 51, a second side face 52, and a bottom face 53. The bottom face 53 is located between the first side face 51 and the second side face 52.

The first side face 51 has a first region 51*a*. The first region 51*a* is in contact with the first body region 28*a*. The first region 51*a* has a first inclination angle (θ1 in FIG. 2) with respect to the first plane P1. The off angle of the first region 51*a* with respect to the (0-33-8) face is 0 degree to 2 degrees. In other words, the first region 51*a* is a plane having a normal line (Y in FIG. 2) inclined by 0 degree to 2 degrees with respect to the [0-33-8] direction. The first inclination angle θ1 is, for example, no less than 56 degrees.

The second side face 52 faces the first side face 51. The second side face 52 has a second inclination angle (θ2 in FIG. 2) with respect to the first plane P1. The second inclination angle θ2 is larger than the first inclination angle θ1. The second inclination angle θ2 is, for example, 80 degrees to 90 degrees. The second side face 52 is, for example, a plane equivalent to the m face.

Regarding the first trench 50, the inclination of the first side face 51 and the inclination of the second side face 52 are different. The inclination of the second side face 52 is larger than the inclination of the first side face 51. The first trench 50 has a right-left asymmetric shape.

The second trench 60 has a first side face 61, a second side face 62, and a bottom face 63. The bottom face 63 is located between the first side face 61 and the second side face 62.

The first side face 61 has a first region 61*a*. The first region 61*a* is in contact with the second body region 28*b*. The first region 61*a* has a first inclination angle with respect to the first plane P1. The off angle of the first region 61*a* with respect to the (0-33-8) face is 0 degree to 2 degrees. In other words, the first region 61*a* is a plane having a normal line inclined by 0 degree to 2 degrees with respect to the [0-33-8] direction. The first inclination angle is, for example, no less than 56 degrees. The second trench 60 has a structure similar to that of the first trench 50.

Regarding the second trench 60, the inclination of the first side face 61 and the inclination of the second side face 62 are different. The inclination of the second side face 62 is larger than the inclination of the first side face 61. The second trench 60 has a right-left asymmetric shape.

The $n^+$-type drain region 24 is provided on the back face side of the silicon carbide layer 10. The drain region 24 contains, for example, nitrogen (N) as n-type impurity. The impurity concentration of n-type impurity in the drain region 24 is, for example, $1\times10^{18}$ $cm^{-3}$ to $1\times10^{21}$ $cm^{-3}$.

The $n^-$-type drift region 26 is provided on the drain region 24. The drift region 26 is formed on, for example, the drain region 24 by epitaxial growth.

The drift region 26 is in contact with the first side face 51 and the first side face 61. The drift region 26 contains, for example, nitrogen (N) as n-type impurity. The impurity concentration of n-type impurity in the drift region 26 is lower than the impurity concentration of re-type impurity in the drain region 24. The impurity concentration of n-type impurity in the drift region 26 is, for example, $4\times10^{14}$ $cm^{-3}$ to $1\times10^{19}$ $cm^{-3}$. The thickness of the drift region 26 is, for example, 5 μm to 150 μm.

The p-type first body region 28*a* is provided between the drift region 26 and the front face of the silicon carbide layer 10. The first body region 28*a* is in contact with the first side face 51. The p-type second body region 28*b* is provided between the drift region 26 and the front face of the silicon carbide layer 10. The first trench 50 is sandwiched between the first body region 28*a* and the second body region 28*b*. The second body region 28*b* is in contact with the first side face 61. The p-type third body region 28*c* is provided between the drift region 26 and the front face of the silicon carbide layer 10. The second trench 60 is sandwiched between the second body region 28*b* and the third body region 28*c*.

The first body region 28*a*, the second body region 28*b*, and the third body region 28*c* function as a channel forming region of the MOSFET 100. For example, when the MOSFET 100 is turned on, a channel through which electrons flow is formed in a region of the first body region 28*a* in contact with the first gate insulating layer 16*a*, and a region of the second body region 28*b* in contact with the second gate insulating layer 16*b*. A region of the first body region 28*a* in contact with the first gate insulating layer 16*a*, and a region of the second body region 28*b* in contact with the second gate insulating layer 16*b* are made into channel forming regions.

In the MOSFET 100, only one side of the first trench 50, that is, the side of the first side face 51 is made into a channel forming region. Moreover, in the MOSFET 100, only one side of the second trench 60, that is, the side of the first side face 61 is made into a channel forming region.

The first body region 28*a*, the second body region 28*b*, and the third body region 28*c* contain, for example, aluminum (Al) as p-type impurity. The impurity concentrations of p-type impurity in the first body region 28*a*, the second body region 28*b*, and the third body region 28*c* are, for example, $5\times10^{16}$ $cm^{-3}$ to $5\times10^{17}$ $cm^{-3}$.

The depths of the first body region 28*a*, the second body region 28*b*, and the third body region 28*c* are, for example, 0.2 μm to 1.0 μm.

The $n^+$-type first source region 30*a* is provided between the first body region 28*a* and the front face of the silicon carbide layer 10. The first source region 30*a* is in contact with the source electrode 12. The first source region 30*a* is in contact with the first gate insulating layer 16*a*.

The $n^+$-type second source region 30*b* is provided between the second body region 28*b* and the front face of the silicon carbide layer 10. The second source region 30*b* is in contact with the source electrode 12. The second source region 30*b* is in contact with the second gate insulating layer 16*b*.

The first source region 30*a* and the second source region 30*b* contain, for example, phosphorus (P) as n-type impurity. The impurity concentrations of n-type impurity in the first source region 30*a* and the second source region 30*b* are higher than the impurity concentration of n-type impurity in the drift region 26.

The impurity concentrations of n-type impurity in the first source region 30*a* and the second source region 30*b* are, for example, $1\times10^{19}$ $cm^{-3}$ to $1\times10^{21}$ $cm^{-3}$. The depths of the first source region 30*a* and the second source region 30*b* are smaller than the depths of the first body region 28*a*, the second body region 28*b*, and the third body region 28*c*, and are, for example, 0.1 μm to 0.3 μm. The distance between the drift region 26 and the first source region 30*a*, and the distance between the drift region 26 and the second source region 30*b* are, for example, 0.1 μm to 0.9 μm.

The $p^+$-type first contact region 34*a* is provided between the second body region 28*b* and the front face of the silicon carbide layer 10. As illustrated in FIG. 3, the $p^+$-type first contact region 34*a* is provided adjacent to the first source region 30*a* in the first direction. The first contact region 34*a* is in contact with the source electrode 12.

The $p^+$-type second contact region 34*b* is provided between the third body region 28*c* and the front face of the silicon carbide layer 10. The $p^+$-type second contact region 34*b* is provided adjacent to the second source region 30*b* in the first direction. The second contact region 34*b* is in contact with the source electrode 12.

The first contact region 34*a* and the second contact region 34*b* contain, for example, aluminum (Al) as p-type impurity. The impurity concentrations of p-type impurity in the first contact region 34*a* and the second contact region 34*b* are, for example, higher than the impurity concentrations of p-type impurity in the first body region 28*a*, the second body region 28*b*, and the third body region 28*c*.

The impurity concentrations of p-type impurity in the first contact region 34*a* and the second contact region 34*b* are, for example, $1\times10^{18}$ $cm^{-3}$ to $1\times10^{21}$ $cm^{-3}$. Moreover, the contact portion to be in contact with the source electrode 12 preferably has a high concentration of, for example, $1\times10^{19}$ $cm^{-3}$ to $1\times10^{21}$ $cm^{-3}$.

The $p^+$-type first electric field relaxation region 32*a* is in contact with the second side face 52 and the bottom face 53 of the first trench 50. The first electric field relaxation region 32*a* is provided between the drift region 26 and the first trench 50.

The first electric field relaxation region 32*a* has, for example, a protrusion protruded toward the second trench 60. The depth of the first electric field relaxation region 32*a* is larger than that of the first trench 50.

The $p^+$-type second electric field relaxation region 32*b* is in contact with the second side face 62 and the bottom face 63 of the second trench 60. The second electric field relaxation region 32*b* is provided between the drift region 26 and the second trench 60.

The depth of the second electric field relaxation region 32*b* is larger than that of the second trench 60. The second electric field relaxation region 32*b* has a structure similar to that of the first electric field relaxation region 32*a*.

The first electric field relaxation region 32*a* and the second electric field relaxation region 32*b* contain, for example, aluminum (Al) as p-type impurity. The impurity concentrations of p-type impurity in the first electric field relaxation region 32*a* and the second electric field relaxation region 32*b* are, for example, higher than the impurity concentrations of p-type impurity in the first body region 28*a*, the second body region 28*b*, and the third body region 28*c*.

The impurity concentrations of p-type impurity in the first electric field relaxation region 32*a* and the second electric field relaxation region 32*b* are, for example, $1\times10^{18}$ $cm^{-3}$ to $1\times10^{21}$ $cm^{-3}$.

The electric potentials of the first electric field relaxation region 32*a* and the second electric field relaxation region 32*b* are fixed to the source electric potential. The first electric field relaxation region 32*a* has a function of relaxing the electric field applied to the second gate insulating layer 16*b*. As with the first electric field relaxation region 32*a*, the second electric field relaxation region 32*b* also has a function of relaxing the electric field applied to an adjacent gate insulating layer not illustrated in the figures.

The first gate electrode 18*a* is provided between the first side face 51 and the second side face 52 of the first trench 50. The first gate electrode 18*a* is provided inside the first trench 50. The first gate electrode 18*a* is provided between the source electrode 12 and the drain electrode 14. The first gate electrode 18*a* is provided on the first gate insulating layer 16*a*. The first gate electrode 18*a* extends in the first direction.

The second gate electrode 18*b* is provided between the first side face 61 and the second side face 62 of the second trench 60. The second gate electrode 18*b* is provided inside the second trench 60. The second gate electrode 18*b* is provided between the source electrode 12 and the drain electrode 14. The second gate electrode 18*b* is provided on the second gate insulating layer 16*b*. The second gate electrode 18*b* extends in the first direction.

The first gate electrode 18*a* and the second gate electrode 18*b* are conductive layers. The first gate electrode 18*a* and the second gate electrode 18*b* are, for example, polycrystalline silicon containing p-type impurity or n-type impurity.

The first gate insulating layer 16*a* is provided between the first gate electrode 18*a* and each region of the first source region 30*a*, the first body region 28*a*, the drift region 26, and the first electric field relaxation region 32*a*. The first gate insulating layer 16*a* between the first body region 28*a* and the first gate electrode 18*a* functions as a gate insulating layer of the MOSFET 100.

The second gate insulating layer 16*b* is provided between the second gate electrode 18*b* and each region of the second source region 30*b*, the second body region 28*b*, the drift region 26, and the second electric field relaxation region 32*b*. The second gate insulating layer 16*b* has a structure and a function similar to those of the first gate insulating layer 16*a*.

The first gate insulating layer 16*a* and the second gate insulating layer 16*b* are, for example, silicon oxide films. For example, a High-k insulating film (high dielectric constant insulating film such as HfSiON, ZrSiON, or AlON) can be applied to the first gate insulating layer 16*a* and the second gate insulating layer 16*b*. Moreover, a stacked film of a silicon oxide film ($SiO_2$) and a High-K insulating film can also be applied.

The first interlayer insulating layer 20*a* is provided on the first gate electrode 18*a*. The first interlayer insulating layer 20*a* is, for example, a silicon oxide film.

The second interlayer insulating layer 20*b* is provided on the second gate electrode 18*b*. The second interlayer insulating layer 20*b* is, for example, a silicon oxide film.

The source electrode 12 is provided on the front face of the silicon carbide layer 10. The source electrode 12 is in contact with the first source region 30*a*, the second source region 30*b*, the first contact region 34*a*, and the second contact region 34*b*.

The source electrode 12 contains metal. The metal forming the source electrode 12 is, for example, a stacked structure of titanium (Ti) and aluminum (Al). The source electrode 12 may contain metal silicide or metal carbide in contact with the silicon carbide layer 10.

The drain electrode 14 is provided on the back face of the silicon carbide layer 10. The drain electrode 14 is in contact with the drain region 24.

The drain electrode 14 is, for example, metal or a metal semiconductor compound. The drain electrode 14 contains a material selected from the group consisting of, for example, nickel silicide (NiSi), titanium (Ti), nickel (Ni), silver (Ag), and gold (Au).

Next, an example of a method of manufacturing a semiconductor device of the first embodiment will be described.

FIGS. 5, 6, 7, 9, 10, 11, 12, and 13 are schematic sectional views illustrating an example of a method of manufacturing a semiconductor device of the first embodiment. FIG. 8 is a schematic plan view illustrating an example of a method of manufacturing a semiconductor device of the first embodiment.

Figure 5:
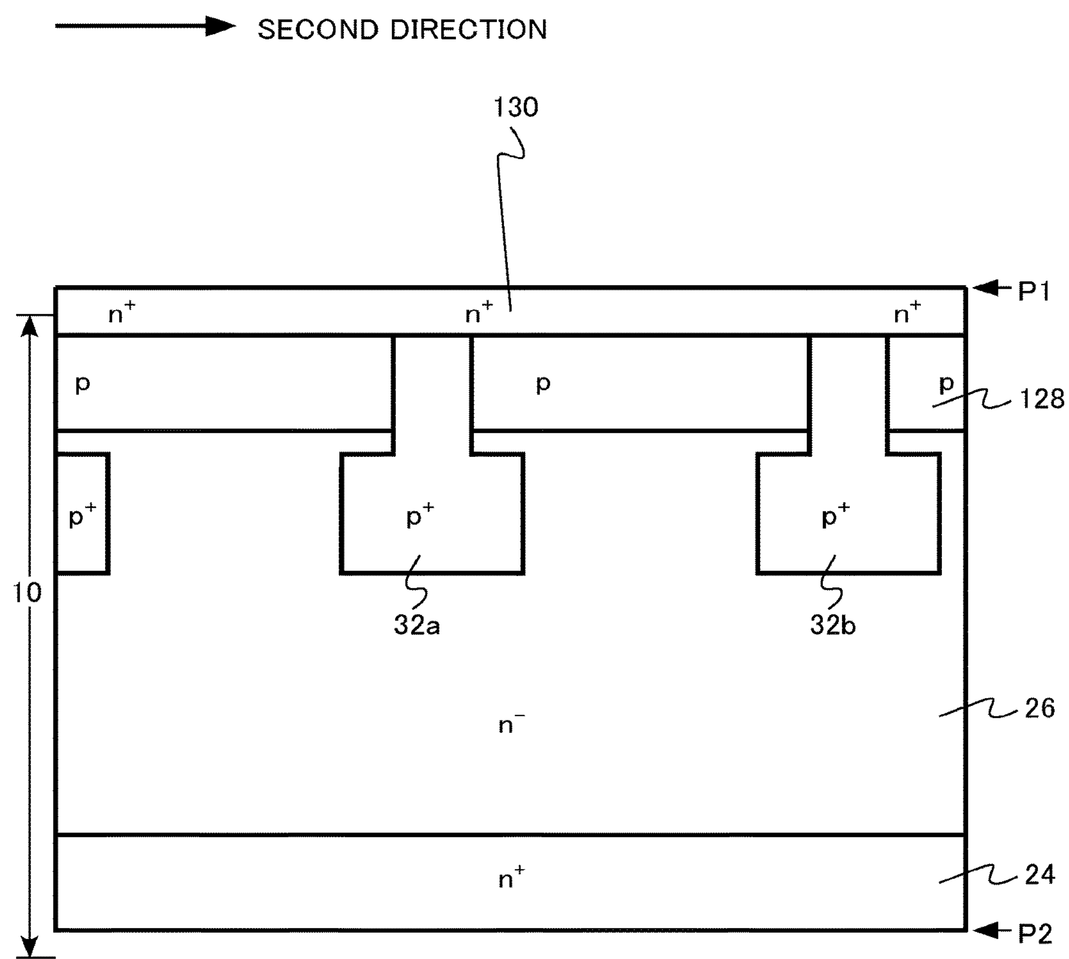
FIG. 5 is a schematic sectional view illustrating an example of a method of manufacturing a semiconductor device of the first embodiment.

First, a silicon carbide wafer having a first plane P1 and a second plane P2 is prepared. The silicon carbide wafer includes a silicon carbide layer 10 having an $n^+$-type drain region 24 and an $n^-$-type drift region 26. Next, a p-type second silicon carbide portion 128, a $p^+$-type fourth silicon carbide portion 130, a $p^+$-type first electric field relaxation region 32*a*, and a $p^+$-type second electric field relaxation region 32*b* are formed in the silicon carbide layer 10 (FIG. 5).

The p-type second silicon carbide portion 128, the $p^+$-type fourth silicon carbide portion 130, the $p^+$-type first electric field relaxation region 32*a*, and the $p^t$-type second electric field relaxation region 32*b* are formed by, for example, an ion implantation method. The $p^+$-type first electric field relaxation region 32*a* and the $p^+$-type second electric field relaxation region 32*b*, which are relatively deep, are formed by, for example, using a high-energy ion implantation apparatus having ion accelerating voltage higher than 1 MeV.

The second silicon carbide portion 128 is finally made into the first body region 28*a*, the second body region 28*b*, and the third body region 28*c*. The fourth silicon carbide portion 130 is finally made into the first source region 30*a* and the second source region 30*b*.

Figure 6:
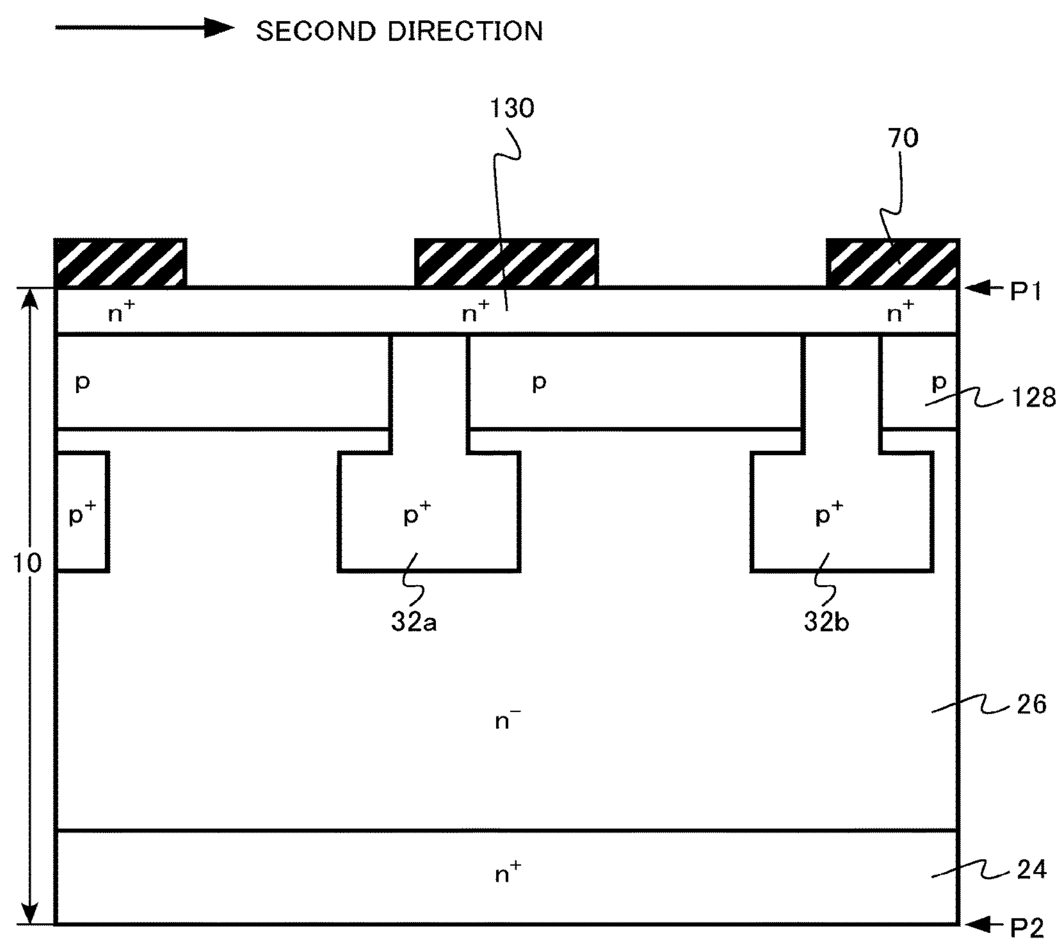
FIG. 6 is a schematic sectional view illustrating an example of a method of manufacturing a semiconductor device of the first embodiment.

Next, a first mask material 70 is formed on the front face of the silicon carbide layer 10 (FIG. 6). The first mask material 70 is formed by, for example, deposition of a film by a chemical vapor deposition (CVD) method, and patterning by a lithography method and a reactive ion etching (RIE) method. The first mask material 70 is, for example, a silicon nitride film.

Figure 7:
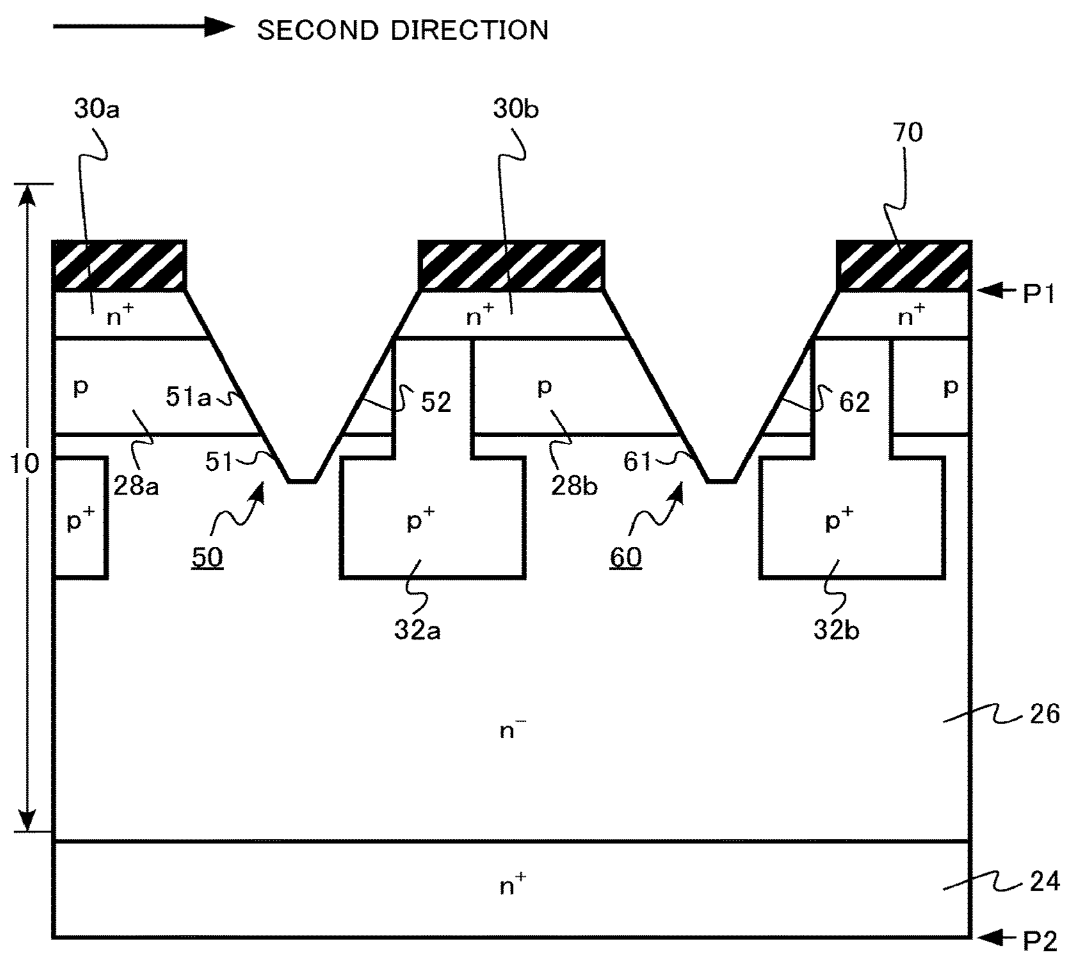
FIG. 7 is a schematic sectional view illustrating an example of a method of manufacturing a semiconductor device of the first embodiment.
Figure 8:
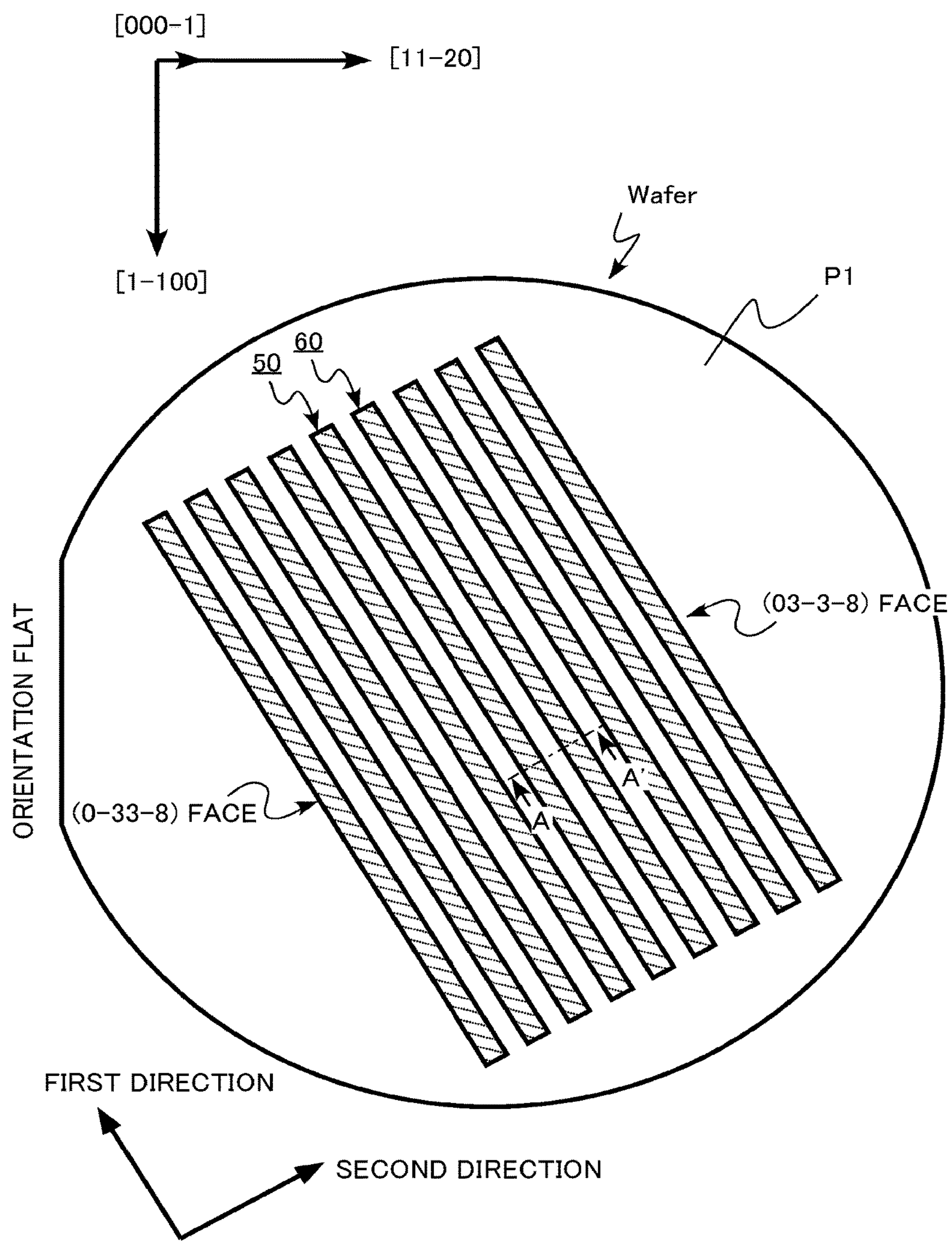
FIG. 8 is a schematic plan view illustrating an example of a method of manufacturing a semiconductor device of the first embodiment.

Next, using the first mask material 70 as a mask, the first trench 50 and the second trench 60 are formed (FIG. 7). The first trench 50 and the second trench 60 are formed by thermochemical etching in a chlorine atmosphere.

The first side face 51 and the second side face 52 of the first trench 50 are made into {0-33-8} faces by thermochemical etching in a chlorine atmosphere. In particular, the first side face 51 is made into a (0-33-8) face. Moreover, the second side face 52 is made into a (03-3-8) face. Similarly, the first side face 61 and the second side face 62 of the second trench 60 are made into {0-33-8} faces.

In order to make the first side face 51 and the second side face 52 of the first trench 50 into {0-33-8} faces by thermochemical etching, the extending direction of the first trench 50 is required to be a specific direction. FIG. 8 schematically illustrates an example of disposition of the first trench 50 on the first plane P1 of the silicon carbide wafer. The orientation flat of the silicon carbide wafer is the [1-100] direction perpendicular to the [11-20] direction. The first plane P1 has an off angle of 0 degree to 8 degrees with respect to the (000-1) face. The [000-1] direction is inclined in the [11-20] direction. In other words, the [000-1] direction is inclined rightward in FIG. 8. The first direction, that is, the extending direction of the first trench 50 is a direction inclined by approximately 60 degrees with respect to the [11-20] direction. In FIG. 8, it is to be noted that the [000-1] direction, the [1-100] direction, and the [11-20] direction projected on the first plane P1 are indicated by arrows.

FIG. 7 is a cross section taken along line AA' of FIG. 8, for example. By forming the first trench 50 on the above-described silicon carbide wafer with the extending direction of the first trench being oriented to the above-described direction, the first side face 51 and the second side face 52 can be made into {0-33-8} faces.

The first side face 51 is made into a (0-33-8) face, and the second side face 52 is made into a (03-38) face. The first region 51*a* is made into a (0-33-8) face.

In a case where the first trench 50 is disposed as illustrated in FIG. 8, the inclination angle of the first side face 51 with respect to the first plane in FIG. 7 becomes larger than the inclination angle of the second side face 52 with respect to the first plane. In other words, the inclination of the first side face 51 becomes larger than the inclination of the second side face 52. This is because the [000-1] direction is inclined in the [11-20] direction. In other words, this is because the (000-1) face has an off angle inclined rightward in FIG. 8 with respect to the first plane.

In FIG. 7, the inclination angle of the first side face 51 with respect to the first plane, and the inclination angle of the second side face 52 with respect to the first plane depend on the magnitude of the off angle of the first plane with respect to the (000-1) face. The inclination angle has a value to be obtained by adding or subtracting a difference depending on the magnitude of the off angle to or from 54.7 degrees that is an angle between the {0-33-8} face and the (000-1) face. For example, in a case where the off angle is 4 degrees, the inclination angle of the first side face 51 with respect to the first plane becomes approximately 58.7 degrees, and the inclination angle of the second side face 52 with respect to the first plane becomes approximately 50.7 degrees.

Figure 9:
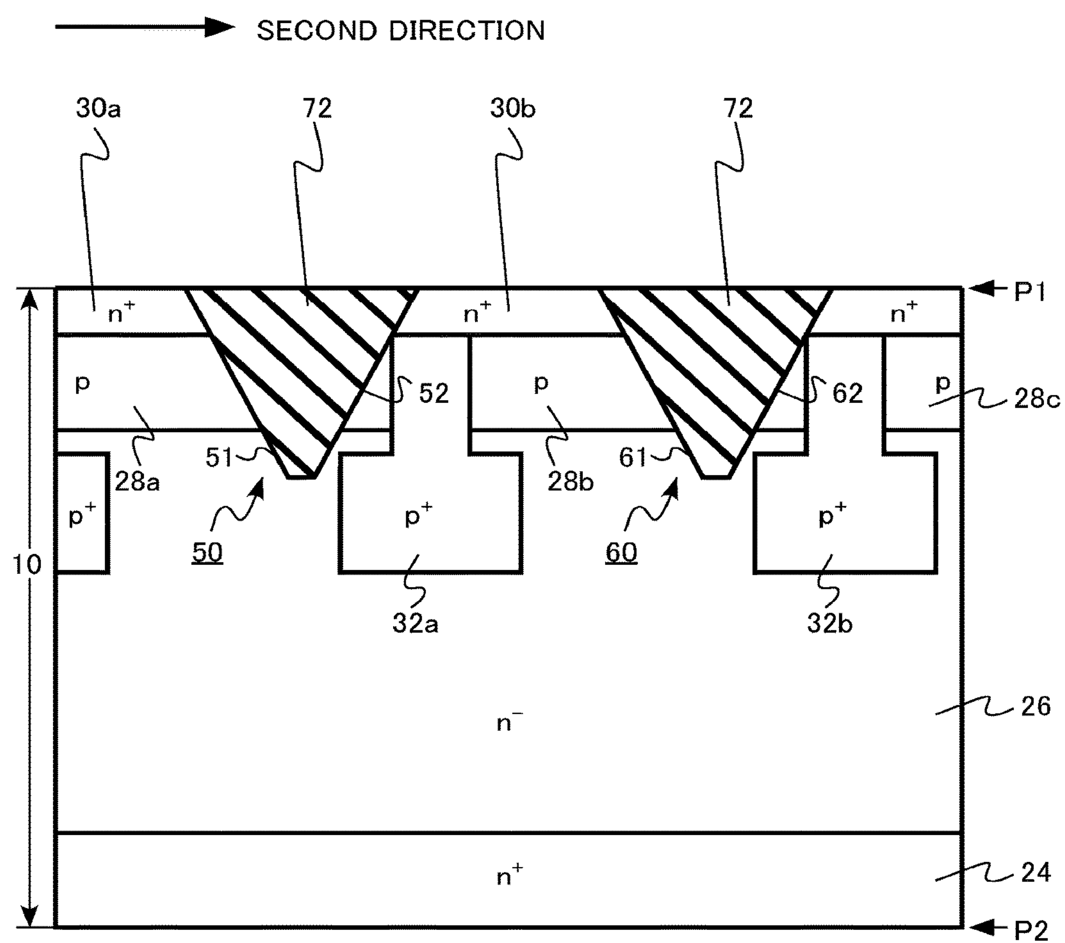
FIG. 9 is a schematic sectional view illustrating an example of a method of manufacturing a semiconductor device of the first embodiment.

Next, after removing the first mask material 70 by a RIE method, the first trench 50 and the second trench 60 are filled with a carbon film 72 by, for example, sputtering (FIG. 9).

Figure 10:
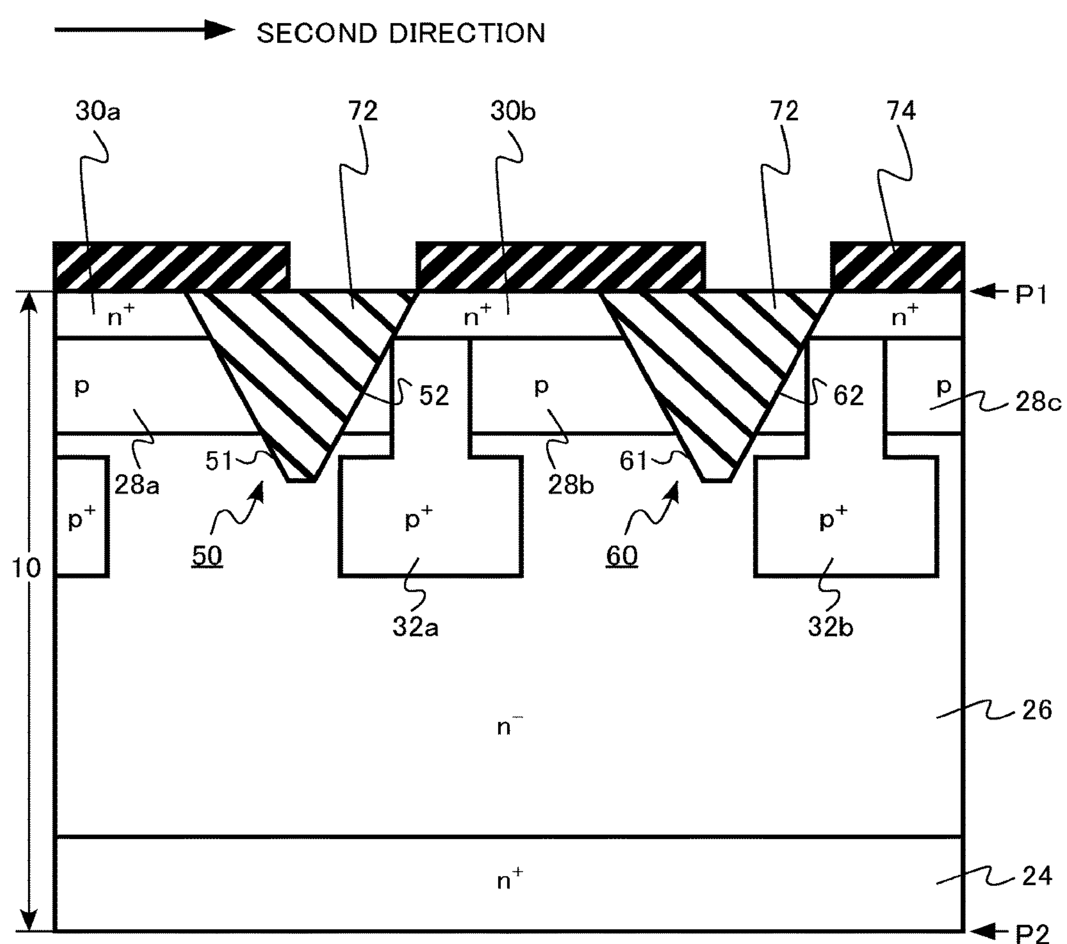
FIG. 10 is a schematic sectional view illustrating an example of a method of manufacturing a semiconductor device of the first embodiment.

Next, a second mask material 74 is formed on the front faces of the silicon carbide layer 10 and the carbon film 72 (FIG. 10). The second mask material 74 is formed by, for example, deposition by a CVD method, and patterning by a lithography method and a RIE method. The second mask material 74 is, for example, a silicon nitride film.

Figure 11:
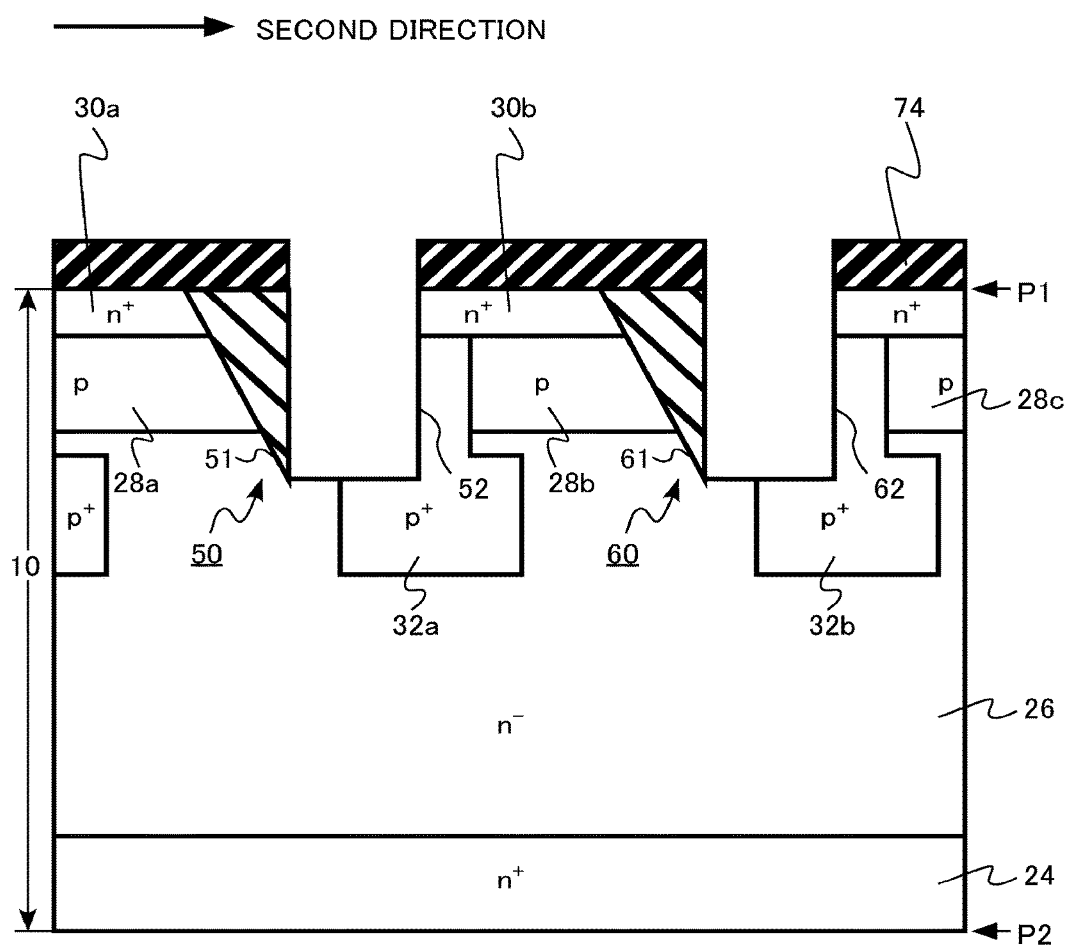
FIG. 11 is a schematic sectional view illustrating an example of a method of manufacturing a semiconductor device of the first embodiment.

Next, using the second mask material 74 as a mask, a part of the carbon film 72 and the silicon carbide layer 10 are etched by a RIE method, so that the inclination angle of the second side face 52 of the first trench 50 with respect to the first plane P1 is increased (FIG. 11). Similarly, the inclination angle of the second side face 62 of the second trench 60 with respect to the first plane P1 is increased.

Figure 12:
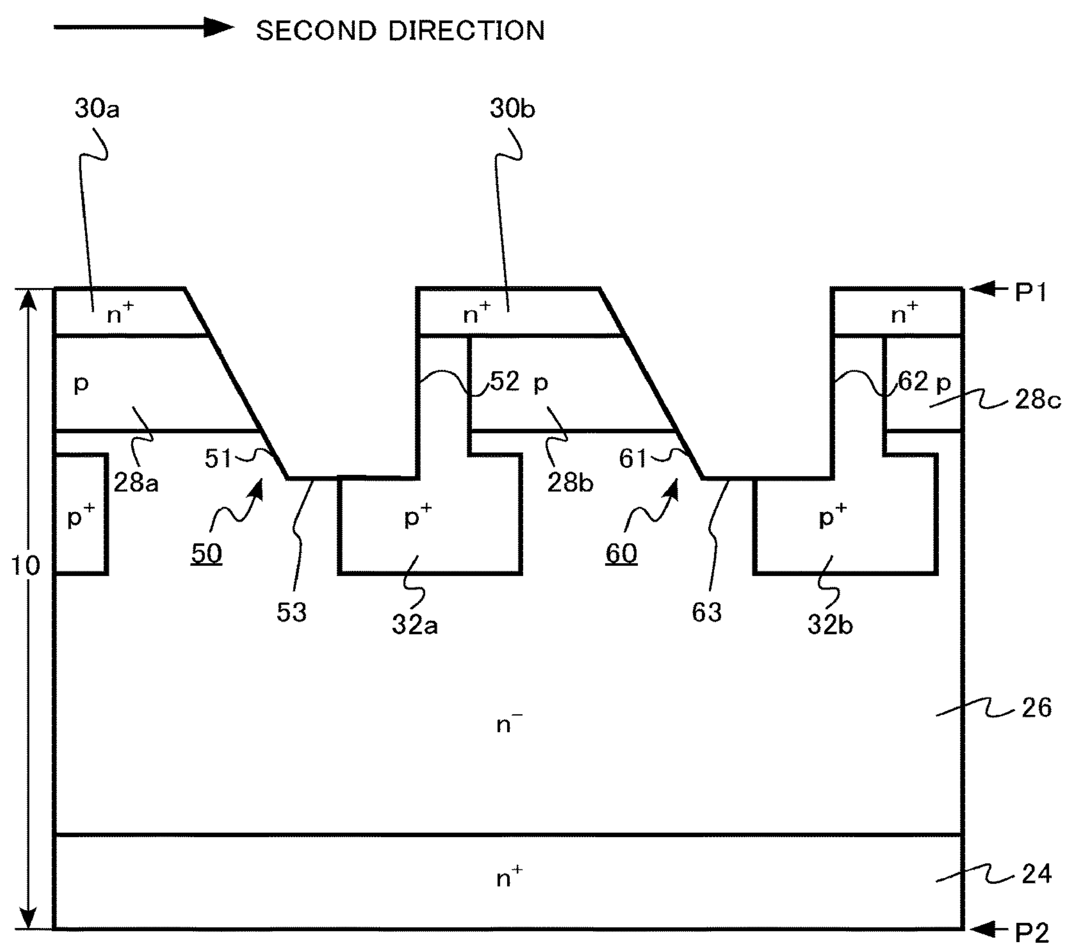
FIG. 12 is a schematic sectional view illustrating an example of a method of manufacturing a semiconductor device of the first embodiment.

Next, the second mask material 74 and the carbon film 72 are removed (FIG. 12).

Next, the first gate insulating layer 16*a* is formed in the first trench 50, and the second gate insulating layer 16*b* is formed in the second trench 60. The first gate insulating layer 16*a* and the second gate insulating layer 16*b* are silicon oxide films formed by, for example, a thermal oxidation method or a CVD method.

Next, the first gate electrode 18*a* is formed on the first gate insulating layer 16*a*. At the same time, the second gate electrode 18*b* is formed on the second gate insulating layer 16*b*. The first gate electrode 18*a* and the second gate electrode 18*b* are, for example, polycrystalline silicon formed by a CVD method.

Figure 13:
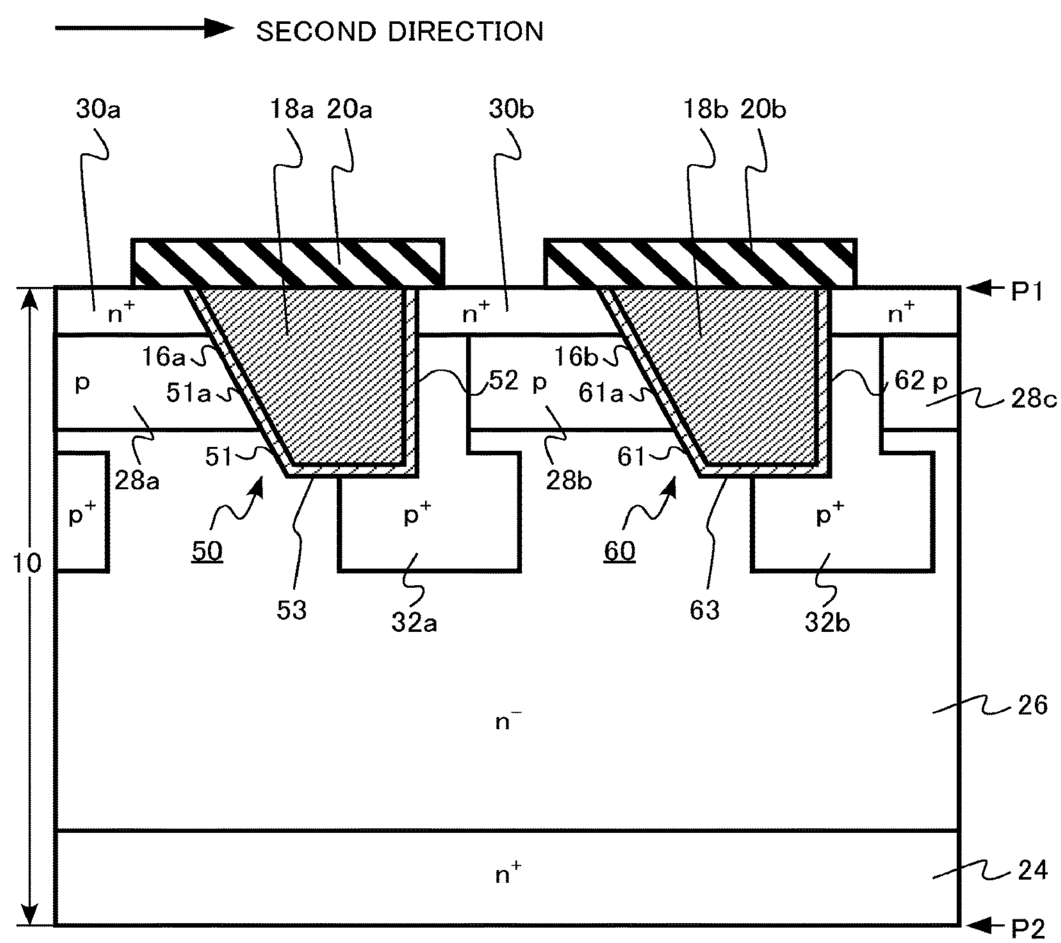
FIG. 13 is an explanatory diagram of the function and effect of a semiconductor device of the first embodiment.

Next, the first interlayer insulating layer 20*a* is formed on the first gate electrode 18*a*. At the same time, the second interlayer insulating layer 20*b* is formed on the second gate electrode 18*b* (FIG. 13). The first interlayer insulating layer 20*a* and the second interlayer insulating layer 20*b* are silicon oxide films formed by, for example, a CVD method.

Thereafter, the source electrode 12 and the drain electrode 14 are formed using a known process technique. By the above manufacturing method, the MOSFET 100 shown in FIG. 1 is manufactured.

Hereinafter, the function and effect of a semiconductor device of the first embodiment will be described.

In the MOSFET 100 of the first embodiment, a {0-33-8} face is made into a channel forming region, and the carrier mobility is improved. Accordingly, the on-resistance of the MOSFET 100 is reduced. Moreover, only one side face of the trench provided at the silicon carbide layer 10 is used as a channel forming region. Accordingly, it becomes possible to reduce the cell size of the unit cell, and the on-resistance of the MOSFET 100 is reduced. Details will be described hereinafter.

The face orientation dependency of the mobility of electrons in silicon carbide is as follows. Silicon Face<<Carbon Face<<m Face<a Face<<{0-33-8} Face. That is, the mobility of electrons on the {0-33-8} face is extremely large.

Regarding the MOSFET 100 of the first embodiment, the off angle of the first region 51*a*, which is in contact with the first body region 28*a*, with respect to the (0-33-8) face is 0 degree to 2 degrees. A channel through which electrons flow when the MOSFET 100 is turned on is formed in the first region 51*a* in contact with the first body region 28*a*. Accordingly, the on-resistance of the MOSFET 100 of the first embodiment is reduced. If the off angle of the first region 51*a* with respect to the (0-33-8) face is out of the above range, the electron mobility is unfavorably lowered. More preferably, the off angle of the first region 51*a* with respect to the (0-33-8) face is 0 degree to 1 degree.

Regarding the MOSFET 100 of the first embodiment, only the side of the first side face 51 of the first trench 50 is used as a channel forming region. The second inclination angle (θ2 in FIG. 2) of the second side face 52 with respect to the first plane P1 is larger than the first inclination angle (θ1 in FIG. 2) of the first region 51*a* with respect to the first plane P1. Accordingly, the width of the first trench 50 in the second direction is decreased, and it becomes possible to reduce the cell size of the unit cell of the MOSFET 100 in the second direction. Thus, the number of cells per unit area is increased, and the on-resistance is reduced.

From the viewpoint of reducing the cell size of the unit cell, the first inclination angle θ1 of the first region 51*a* with respect to the first plane P1 is preferably no less than 56 degrees, more preferably no less than 57 degrees, or further preferably no less than 58 degrees. It is possible to control the first inclination angle θ1 by controlling the off angle of the first plane P1 with respect to the (000-1) face and the disposition of the first trench 50.

Moreover, from the viewpoint of decreasing the width of the first trench 50 in the second direction and reducing the cell size of the unit cell, the second inclination angle θ2 of the second side face 52 with respect to the first plane P1 is preferably 80 degrees to 90 degrees, more preferably 85 degrees to 90 degrees, or even more preferably 88 degrees to 90 degrees. As illustrated in FIG. 11, it is possible to control the second inclination angle 82 by controlling the etching conditions for etching the silicon carbide layer 10 of the first trench 50 by a RIE method.

Regarding the MOSFET 100 of the first embodiment, only the side of the first side face 51 of the first trench 50 is used as a channel forming region. For example, regarding the first trench 50 of FIG. 7, the inclination angle of the first side face 51 and the inclination angle of the second side face 52 are different as described above. If both side faces having different inclination angles are used as channel forming regions, transistors with different characteristics are formed on the left and right sides of the trench, and therefore there is a possibility that the characteristic variation of the MOSFET becomes large. In the MOSFET 100 of the first embodiment, by using only the side of the first side face 51 as a channel forming region, the characteristic variation of the MOSFET is suppressed.

The MOSFET 100 of the first embodiment is provided with a first electric field relaxation region 32*a*. As a result, the electric field intensity applied to the second gate insulating layer 16*b* when the MOSFET 100 is turned off is relaxed. Accordingly, dielectric breakdown of the second gate insulating layer 16*b* hardly occurs, and the reliability of the MOSFET 100 is improved.

In the MOSFET 100 of the first embodiment, the first plane P1 is a (000-1) face, that is, the off angle of the first plane with respect to the carbon face is no more than 8 degrees. By setting the first plane P1 to be a plane close to the carbon face, the first side face 51 of a trench to be a {0-33-8} face can be a forward tapered face. Moreover, if the off angle exceeds the above range, the breakdown voltage of the MOSFET may possibly lower. From the viewpoint of realizing a high breakdown voltage, the off angle is preferably no more than 4 degrees.

(First Variation)

Figure 14:
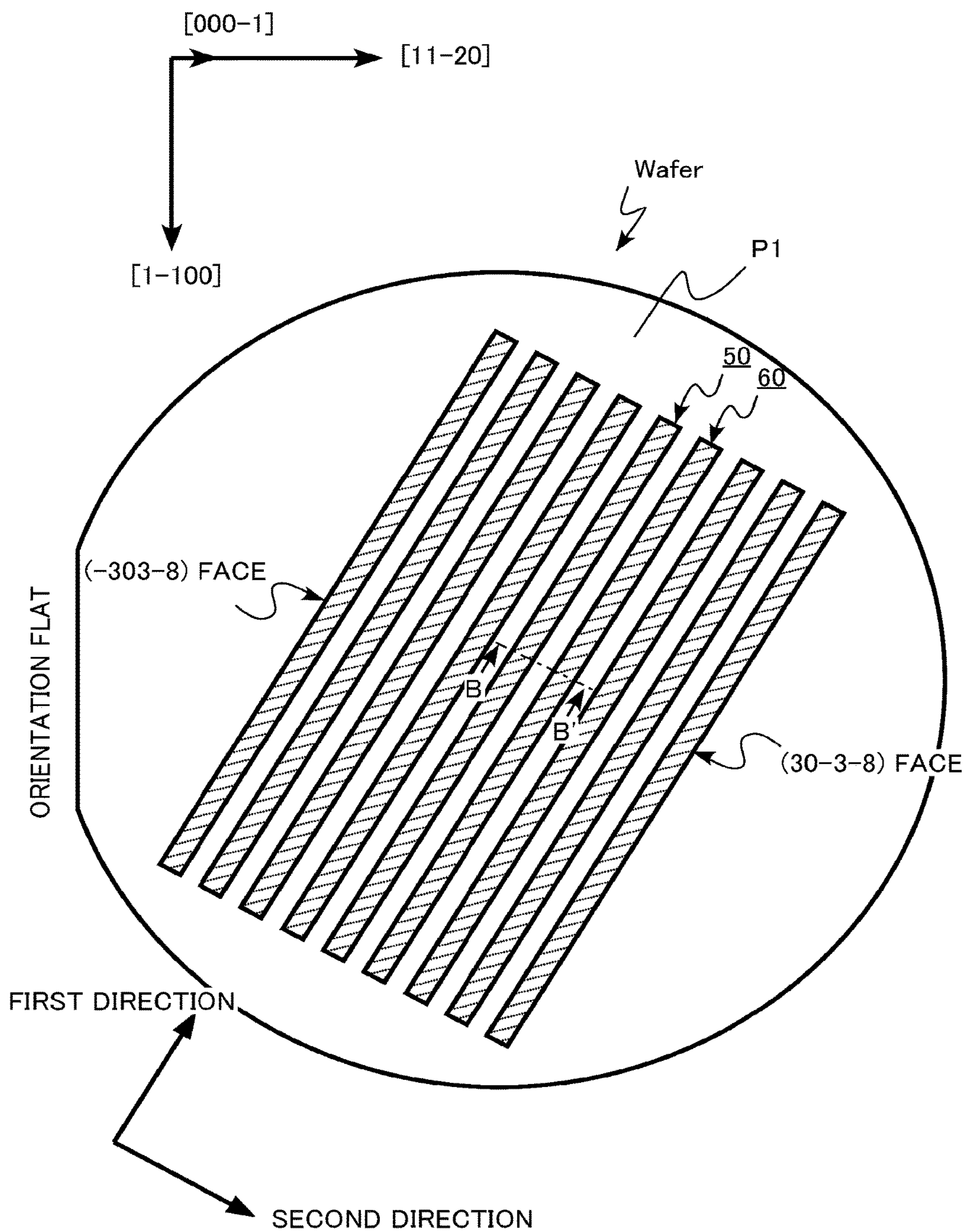
FIG. 14 is a schematic plan view illustrating a first variation of a method of manufacturing a semiconductor device of the first embodiment.

FIG. 14 is a schematic plan view illustrating a first variation of a method of manufacturing a semiconductor device of the first embodiment. FIG. 14 schematically illustrates an example of disposition of the first trench 50 on the first plane P1 of a silicon carbide wafer. FIG. 14 is a figure corresponding to FIG. 8 described above.

The orientation flat of the silicon carbide wafer is the [1-100] direction perpendicular to the [11-20] direction. The first plane P1 has an off angle of 0 degree to 8 degrees with respect to the (000-1) face. The [000-1] direction is inclined in the [11-20] direction. In other words, the [000-1] direction is inclined rightward in FIG. 14. The first direction, that is, the extending direction of the first trench 50 is a direction inclined by approximately 60 degrees with respect to the [11-20] direction. In FIG. 14, it is to be noted that the [000-1] direction, the [1-100] direction, and the [11-20] direction projected on the first plane P1 are indicated by arrows.

FIG. 7 is a cross section taken along line BB' of FIG. 14, for example. By forming the first trench 50 on the silicon carbide wafer with the extending direction of the first trench being oriented to the above-described direction, the first side face 51 and the second side face 52 can be made into {0-33-8} faces.

The first side face 51 is made into a (−303-8) face, and the second side face 52 is made into a (30-38) face. The first region 51*a* is made into a (−303-8) face.

In a case where the first trench 50 is disposed as illustrated in FIG. 14, the inclination angle of the first side face 51 with respect to the first plane in FIG. 7 becomes larger than the inclination angle of the second side face 52 with respect to the first plane. In other words, the inclination of the first side face 51 becomes larger than the inclination of the second side face 52. This is because the [000-1] direction is inclined in the [11-20] direction. In other words, this is because the (000-1) face has an off angle inclined rightward in FIG. 14 with respect to the first plane.

The inclination angle of the first side face 51 with respect to the first plane, and the inclination angle of the second side face 52 with respect to the first plane depend on the magnitude of the off angle of the first plane with respect to the (000-1) face. The inclination angle has a value to be obtained by adding or subtracting a difference depending on the magnitude of the off angle to or from 54.7 degrees that is an angle between the {0-33-8} face and the (000-1) face. For example, in a case where the off angle is 4 degrees, the inclination angle of the first side face 51 with respect to the first plane becomes approximately 58.7 degrees, and the inclination angle of the second side face 52 with respect to the first plane becomes approximately 50.7 degrees.

The on-resistance of the MOSFET manufactured in the first variation can also be reduced by a function similar to that of the MOSFET 100 of the first embodiment.

(Second Variation)

Figure 15:
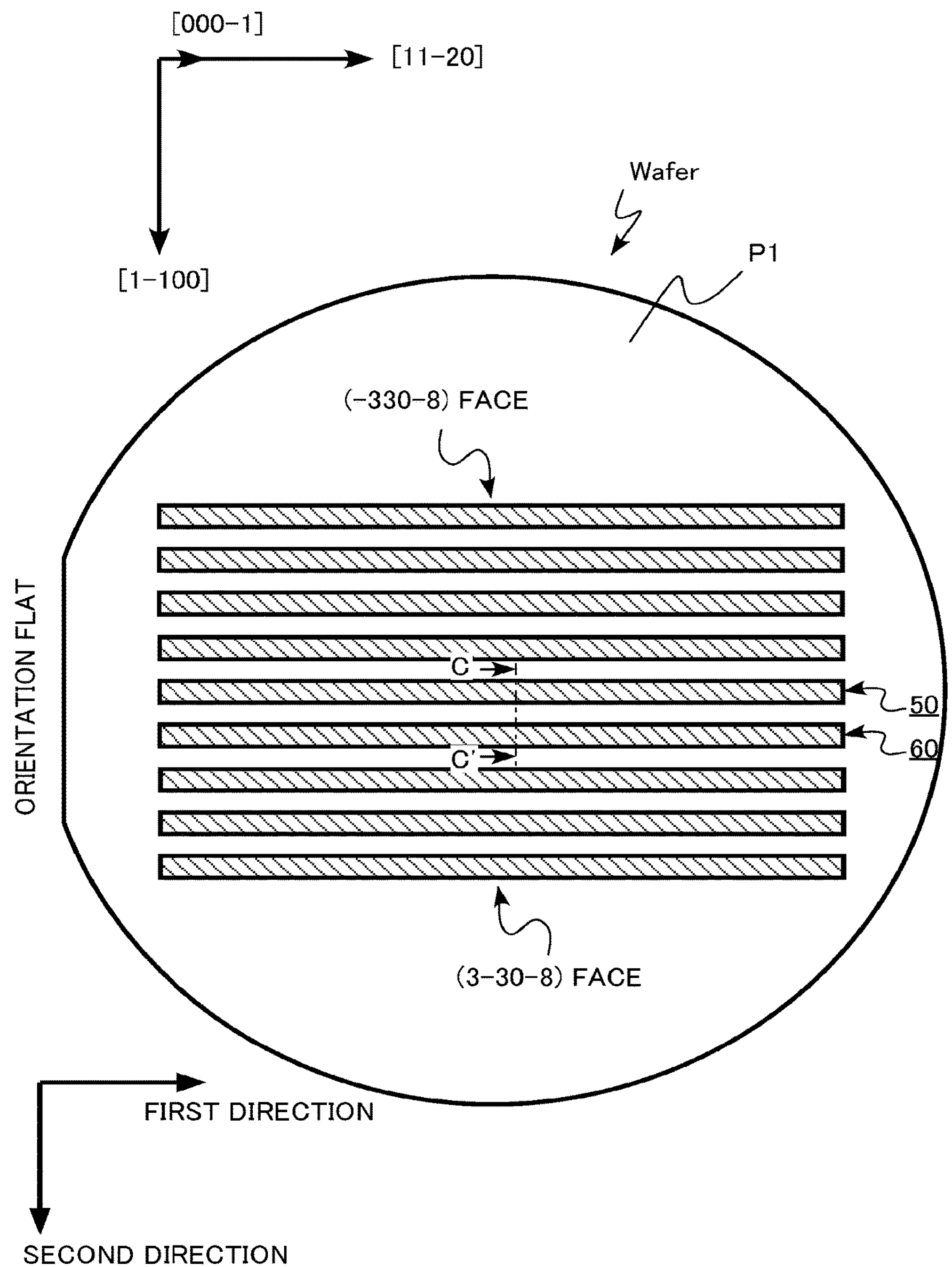
FIG. 15 is a schematic plan view illustrating a second variation of a method of manufacturing a semiconductor device of the first embodiment.

FIG. 15 is a schematic plan view illustrating a second variation of a method of manufacturing a semiconductor device of the first embodiment. FIG. 15 schematically illustrates an example of disposition of the first trench 50 on the first plane P1 of a silicon carbide wafer. FIG. 15 is a figure corresponding to FIG. 8 described above.

The orientation flat of the silicon carbide wafer is the [1-100] direction perpendicular to the [11-20] direction. The first plane P1 has an off angle of 0 degree to 8 degrees with respect to the (000-1) face. The [000-1] direction is inclined in the [11-20] direction. In other words, the [000-1] direction is inclined rightward in FIG. 15. The first direction, that is, the extending direction of the first trench 50 is substantially parallel to the [11-20] direction. In FIG. 15, it is to be noted that the [000-1] direction, the [1-100] direction, and the [11-20] direction projected on the first plane P1 are indicated by arrows.

FIG. 7 is a cross section taken along line CC' of FIG. 15, for example. By forming the first trench 50 on the silicon carbide wafer with the extending direction of the first trench being oriented to the above-described direction, the first side face 51 and the second side face 52 can be made into {0-33-8} faces.

The first side face 51 is made into a (−330-8) face, and the second side face 52 is made into a (3-308) face. The first region 51*a* is made into a (−330-8) face.

In a case where the first trench 50 is disposed as illustrated in FIG. 15, the inclination angle of the first side face 51 with respect to the first plane in FIG. 7 becomes the same as the inclination angle of the second side face 52 with respect to the first plane. This is because the first trench 50 has a right-left symmetric shape, since the first direction is substantially parallel to the [11-20] direction.

The inclination angle of the first side face 51 with respect to the first plane, and the inclination angle of the second side face 52 with respect to the first plane do not basically depend on the magnitude of the off angle of the first plane with respect to the (000-1) face. Accordingly, the inclination angle of the first side face 51 with respect to the first plane, and the inclination angle of the second side face 52 with respect to the first plane become close to 54.7 degrees that is an angle between the {0-33-8} face and the (000-1) face.

The on-resistance of the MOSFET manufactured in the second variation can also be reduced by a function similar to that of the MOSFET 100 of the first embodiment. However, in the second variation, the inclination angle θ1 of the first side face 51 of the first region 51*a* with respect to the first plane is approximately 54.7 degrees. Therefore, as compared with a case where disposition of the first trench 50 illustrated in FIG. 8 or 14 is employed, the cell size of the unit cell in the second direction becomes larger. Accordingly, the effect of reducing the on-resistance is decreased.

As described above, with a MOSFET 100 of the first embodiment and variations thereof, the on-resistance of the MOSFET is reduced. Moreover, the breakdown voltage of the gate insulating layer is improved, and the reliability of the MOSFET is improved.

Second Embodiment

A semiconductor device of the second embodiment differs from the first embodiment in that a first side face has a second region closer to the second plane than a first region, and a third inclination angle of the second region with respect to the first plane is larger than the first inclination angle. Hereinafter, a part of description on contents overlapped with the first embodiment will be omitted.

Figure 16:
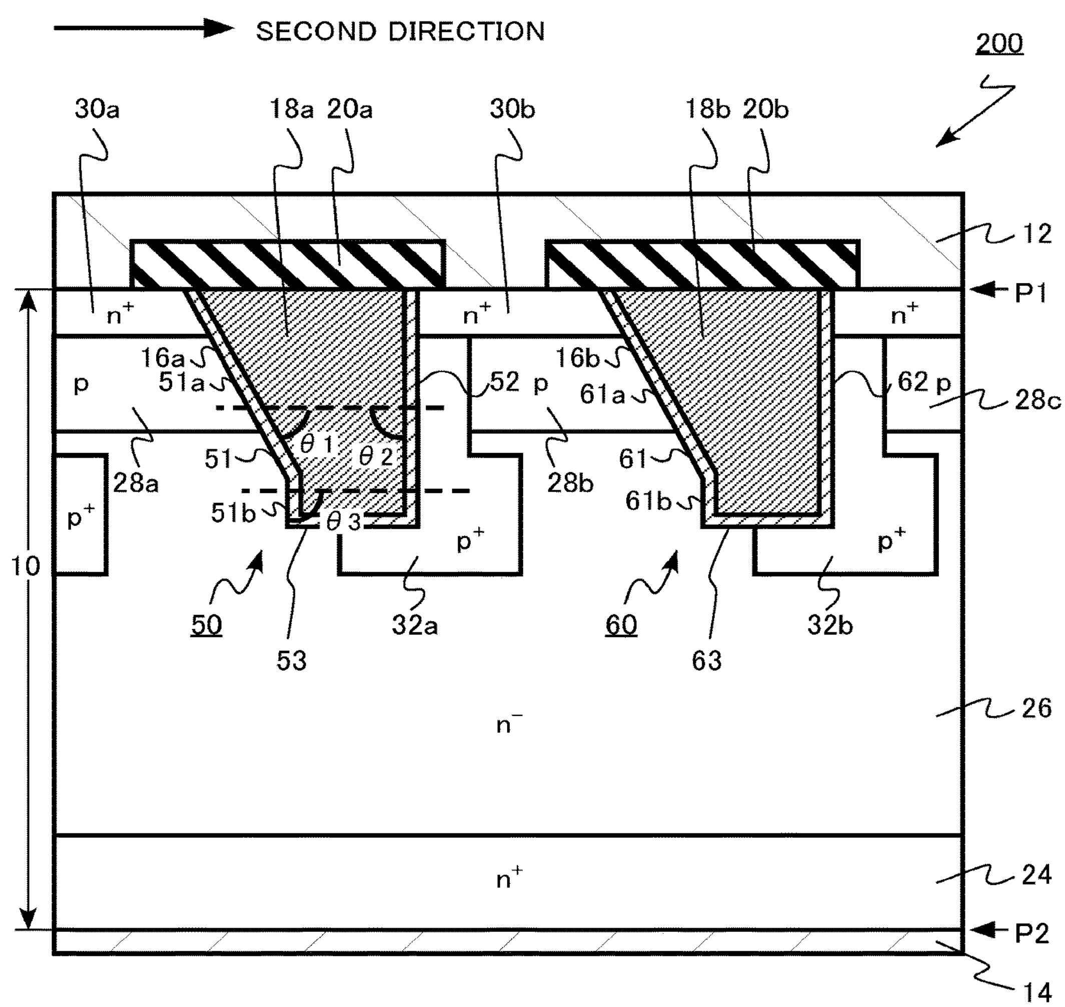
FIG. 16 is a schematic sectional view of a semiconductor device of the second embodiment.

FIG. 16 is a schematic sectional view of a semiconductor device of the second embodiment. The semiconductor device of the second embodiment is a trench gate type vertical MOSFET 200 using silicon carbide. In the second embodiment, the first conductivity type is n type, and the second conductivity type is p type. The MOSFET 200 is an n-channel MOSFET using electrons as carriers.

The MOSFET 200 is provided with a silicon carbide layer 10, a source electrode 12 (first electrode), a drain electrode 14 (second electrode), a first gate insulating layer 16*a* (gate insulating layer), a second gate insulating layer 16*b*, a first gate electrode 18*a* (gate electrode), a second gate electrode 18*b*, a first interlayer insulating layer 20*a*, a second interlayer insulating layer 20*b*, a first trench 50 (trench), and a second trench 60.

Provided in the silicon carbide layer 10 are an $n^+$-type drain region 24 (seventh silicon carbide region), an $n^-$-type drift region 26 (first silicon carbide region), a p-type first body region 28*a* (second silicon carbide region), a p-type second body region 28*b* (third silicon carbide region), a p-type third body region 28*c*, an $n^+$-type first source region 30*a* (fourth silicon carbide region), an $n^+$-type second source region 30*b* (fifth silicon carbide region), a $p^+$-type first electric field relaxation region 32*a* (sixth silicon carbide region), a $p^+$-type second electric field relaxation region 32*b*, a $p^+$-type first contact region 34*a*, and a $p^+$-type second contact region 34*b*.

The first trench 50 and the second trench 60 exist in the silicon carbide layer 10. The first trench 50 and the second trench 60 extend in the first direction. The first trench 50 and the second trench 60 are part of the silicon carbide layer 10.

The first trench 50 has a first side face 51, a second side face 52, and a bottom face 53. The bottom face 53 is located between the first side face 51 and the second side face 52.

The first side face 51 has a first region 51*a* and a second region 51*b*. The first region 51*a* is in contact with the first body region 28*a*. The first region 51*a* has a first inclination angle (θ1 in FIG. 16) with respect to the first plane P1. The off angle of the first region 51*a* with respect to the (0-33-8) face is 0 degree to 2 degrees. In other words, the first region 51*a* is a plane having a normal line inclined by 0 degree to 2 degrees with respect to the [0-33-8] direction. The first inclination angle θ1 is, for example, no less than 56 degrees.

The second region 51*b* is closer to the second plane P2 than the first region 51*a*. The second region 51*b* has a third inclination angle (e3 in FIG. 16) with respect to the first plane P1. The third inclination angle θ3 is larger than the first inclination angle θ1. In other words, the inclination of the second region 51*b* is larger than the inclination of the first region 51*a*.

The second side face 52 faces the first side face 51. The second side face 52 has a second inclination angle (θ2 in FIG. 16) with respect to the first plane P1. The second inclination angle θ2 is larger than the first inclination angle θ1. The second inclination angle is, for example, 80 degrees to 90 degrees.

Regarding the first trench 50, the inclination of the first side face 51 and the inclination of the second side face 52 are different. The inclination of the second side face 52 is larger than the inclination of the first side face 51. The first trench 50 has a right-left asymmetric shape.

The second trench 60 has a first side face 61, a second side face 62, and a bottom face 63. The bottom face 63 is located between the first side face 61 and the second side face 62.

The first side face 61 has a first region 61*a* and a second region 61*b*. The second region 61*b* is closer to the second plane P2 than the first region 61*a*. The second trench 60 has a structure similar to that of the first trench 50.

Figure 17:
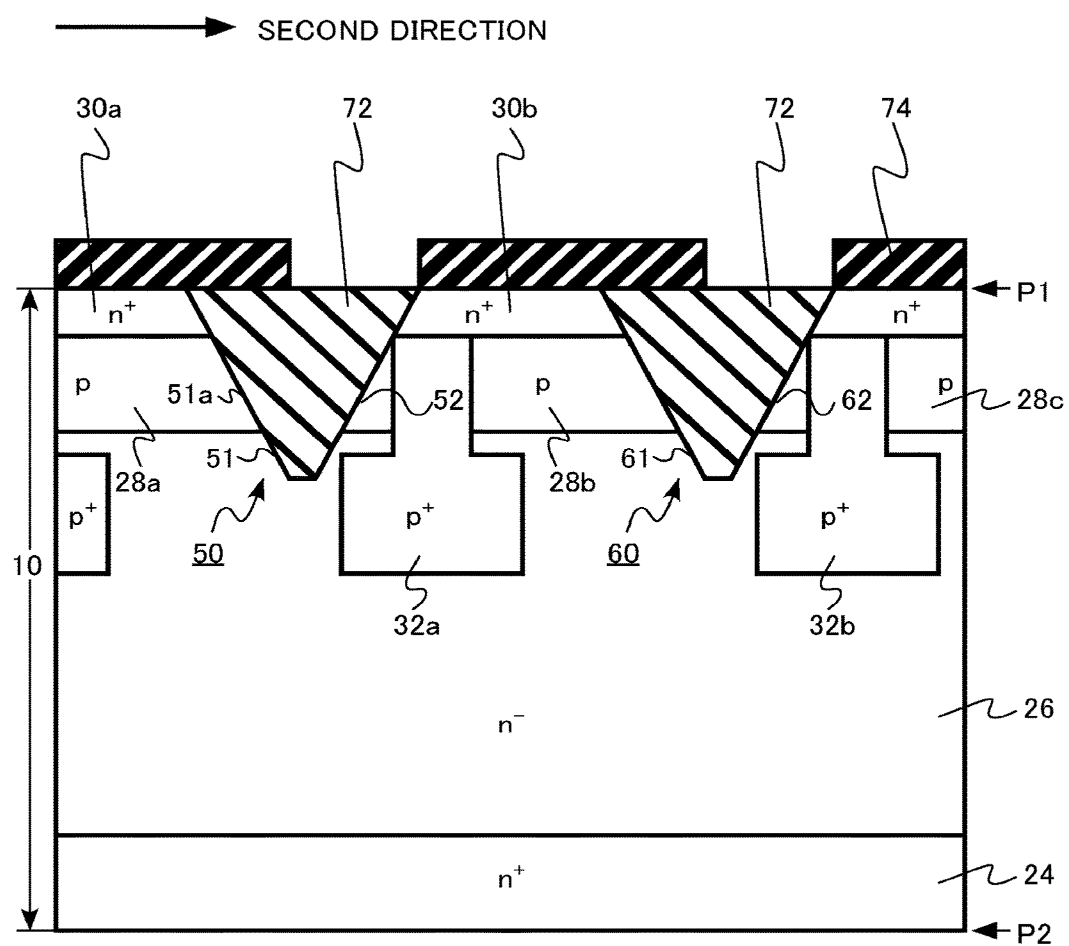
FIG. 17 is a schematic sectional view illustrating an example of a method of manufacturing a semiconductor device of the second embodiment.
Figure 18:
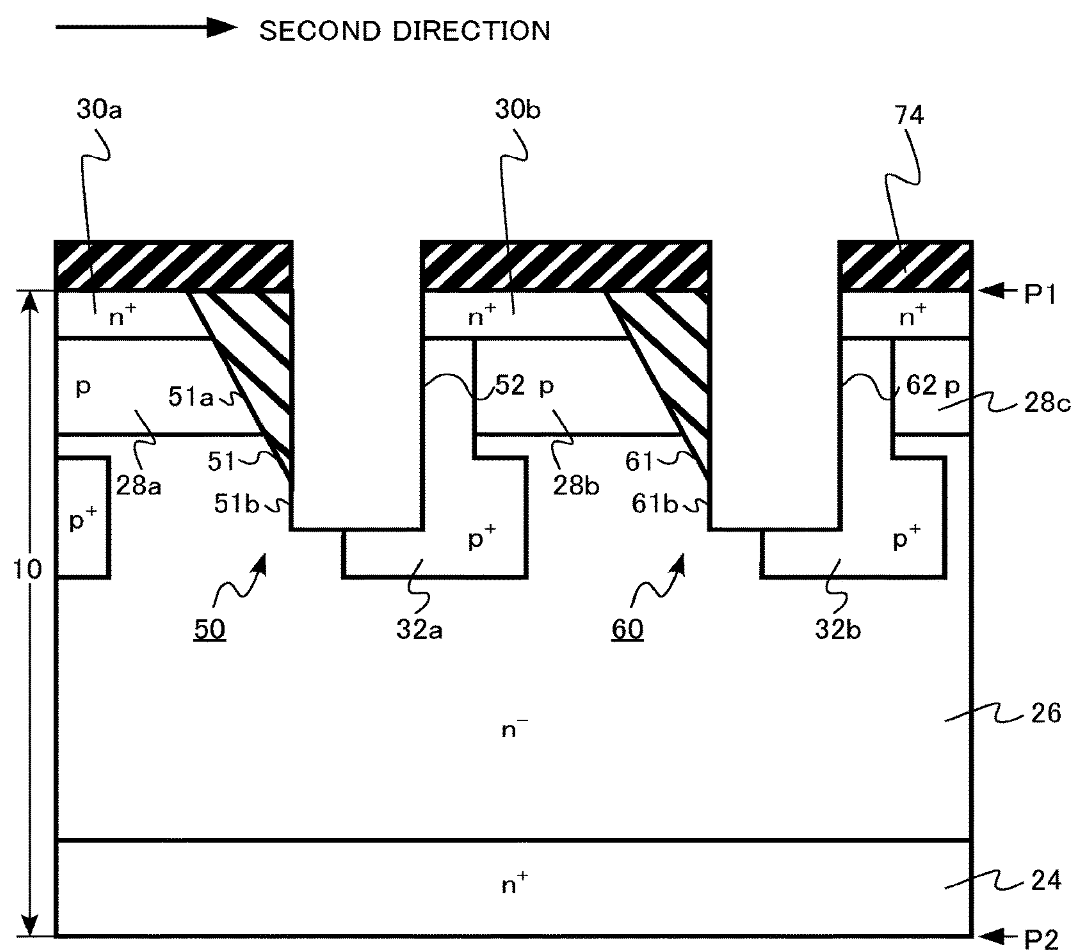
FIG. 18 is a schematic sectional view illustrating an example of a method of manufacturing a semiconductor device of the second embodiment.
Figure 19:
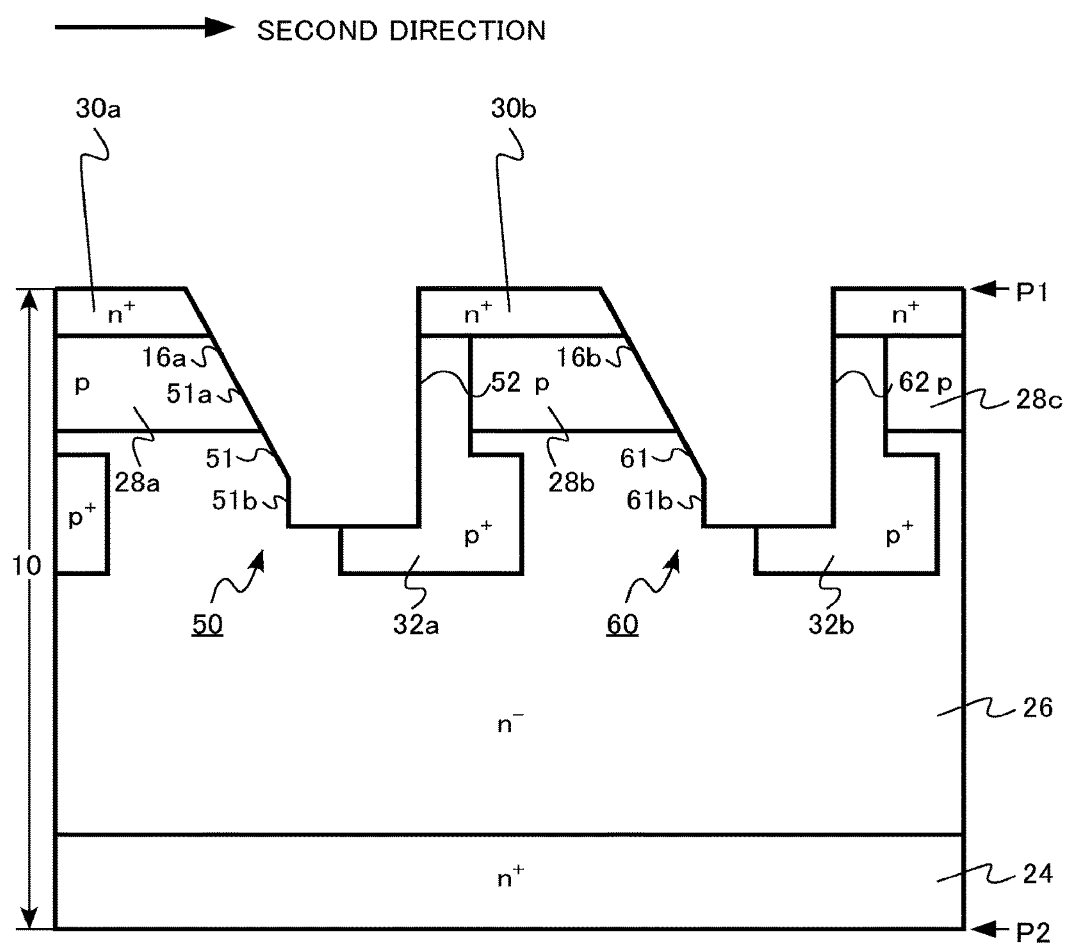
FIG. 19 is a schematic sectional view illustrating an example of a method of manufacturing a semiconductor device of the second embodiment.

FIGS. 17, 18, and 19 are schematic sectional views illustrating an example of a method of manufacturing a semiconductor device of the second embodiment.

FIG. 17 illustrates a cross section of the same process as FIG. 10 of the first embodiment. The manufacturing method up to FIG. 17 is the same as that of the first embodiment and will therefore be omitted.

Next, using the second mask material 74 as a mask, a part of the carbon film 72 and the silicon carbide layer 10 are etched by a RIE method, so that the inclination angle of the second side face 52 of the first trench 50 with respect to the first plane P1 is increased (FIG. 18). Similarly, the inclination angle of the second side face 62 of the second trench 60 with respect to the first plane P1 is increased.

On this occasion, the silicon carbide layer 10 is etched to a position deeper than the bottom face of the first trench 50 and the bottom face of the second trench 60 formed by thermochemical etching. By this etching, the second region 51*b* and the second region 61*b* are formed.

Next, the second mask material 74 and the carbon film 72 are removed (FIG. 19). Thereafter, the MOSFET 200 illustrated in FIG. 16 is manufactured by a method similar to that of the first embodiment.

With the MOSFET 200 of the second embodiment, over etching is allowed when the first trench 50 and the second trench 60 are etched by a RIE method. Therefore, the processing margin for etching the first trench 50 and the second trench 60 by a RIE method increases. Accordingly, it becomes possible to manufacture a MOSFET 200 with stable characteristics.

With the MOSFET 200 of the second embodiment, the on-resistance of the MOSFET is reduced as with the MOSFET 100 of the first embodiment as described above. Moreover, the breakdown voltage of the gate insulating layer is improved, and the reliability of the MOSFET is improved. Furthermore, the processing margin at the time of manufacturing increases, and it becomes possible to manufacture a MOSFET 200 with stable characteristics.

Third Embodiment

An inverter circuit and a driving device of the third embodiment are a driving device provided with a semiconductor device of the first embodiment.

Figure 20:
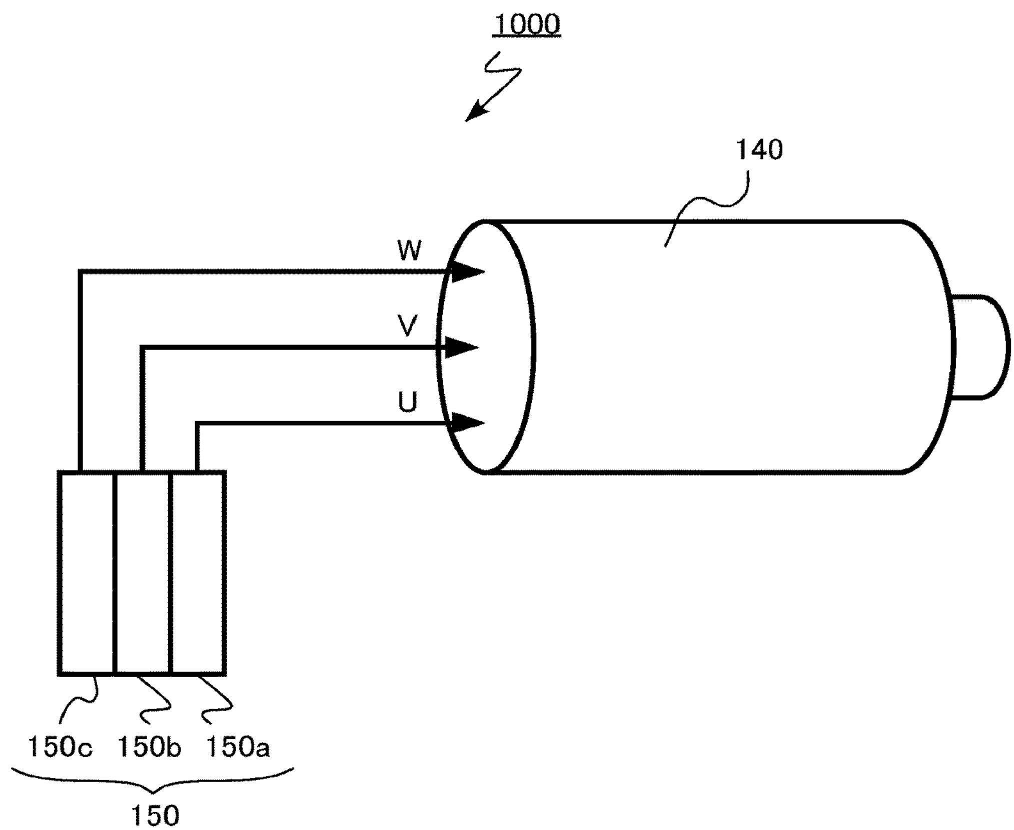
FIG. 20 is a schematic diagram of a driving device of the third embodiment.

FIG. 20 is a schematic diagram of the driving device of the third embodiment. A driving device 1000 is provided with a motor 140 and an inverter circuit 150.

The inverter circuit 150 is composed of three semiconductor modules 150*a*, 150*b*, and 150*c* using the MOSFET 100 of the first embodiment as a switching element. By connecting the three semiconductor modules 150*a*, 150*b*, and 150*c* in parallel, a three-phase inverter circuit 150 provided with three AC voltage output terminals U, V, and W is realized. AC voltage outputted from the inverter circuit 150 drives the motor 140.

With the third embodiment, the characteristics of the inverter circuit 150 and the driving device 1000 are improved by providing the MOSFET 100 with improved characteristics.

Fourth Embodiment

A vehicle of the fourth embodiment is a vehicle provided with a semiconductor device of the first embodiment.

Figure 21:
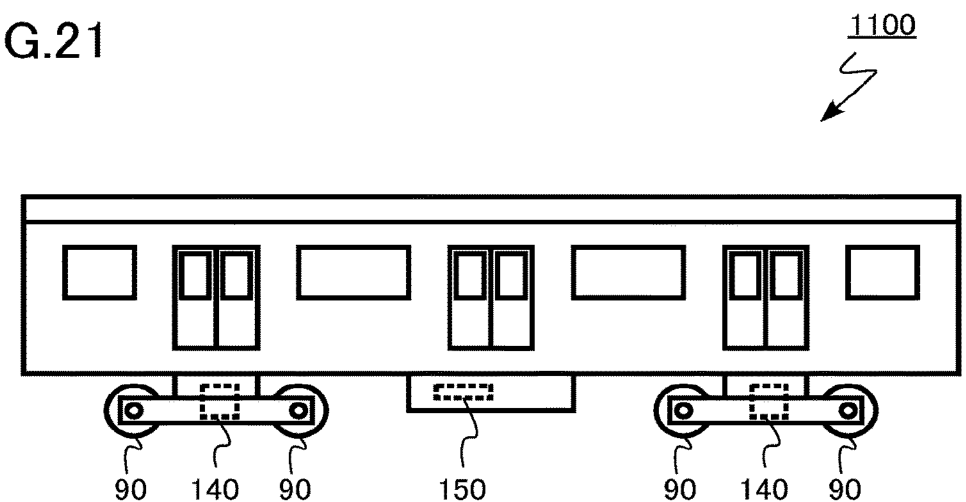
FIG. 21 is a schematic diagram of a vehicle of the fourth embodiment.

FIG. 21 is a schematic diagram of the vehicle of the fourth embodiment. A vehicle 1100 of the fourth embodiment is a railway vehicle. The vehicle 1100 is provided with motors 140 and an inverter circuit 150.

The inverter circuit 150 is composed of three semiconductor modules using the MOSFET 100 of the first embodiment as a switching element. By connecting three semiconductor modules in parallel, a three-phase inverter circuit 150 provided with three AC voltage output terminals U, V, and W is realized. AC voltage outputted from the inverter circuit 150 drives the motor 140. Wheels 90 of the vehicle 1100 are rotated by the motors 140.

With the fourth embodiment, the characteristics of the vehicle 1100 are improved by providing the MOSFET 100 with improved characteristics.

Fifth Embodiment

A vehicle of the fifth embodiment is a vehicle provided with the semiconductor device of the first embodiment.

Figure 22:
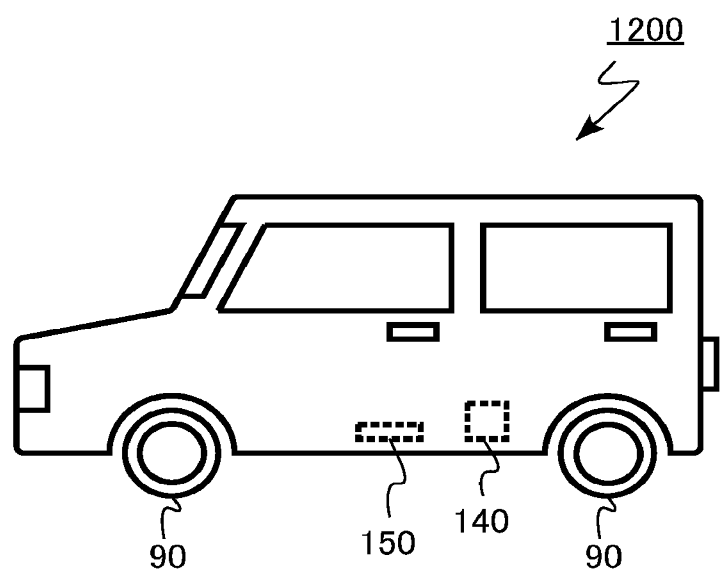
FIG. 22 is a schematic diagram of a vehicle of the fifth embodiment.

FIG. 22 is a schematic diagram of the vehicle of the fifth embodiment. A vehicle 1200 of the fifth embodiment is an automobile. The vehicle 1200 is provided with a motor 140 and an inverter circuit 150.

The inverter circuit 150 is composed of three semiconductor modules using the MOSFET 100 of the first embodiment as a switching element. By connecting three semiconductor modules in parallel, a three-phase inverter circuit 150 provided with three AC voltage output terminals U, V, and W is realized.

AC voltage outputted from the inverter circuit 150 drives the motor 140. Wheels 90 of the vehicle 1200 are rotated by the motor 140.

With the fifth embodiment, the characteristics of the vehicle 1200 are improved by providing the MOSFET 100 with improved characteristics.

Sixth Embodiment

An elevator of the sixth embodiment is an elevator provided with a semiconductor device of the first embodiment.

Figure 23:
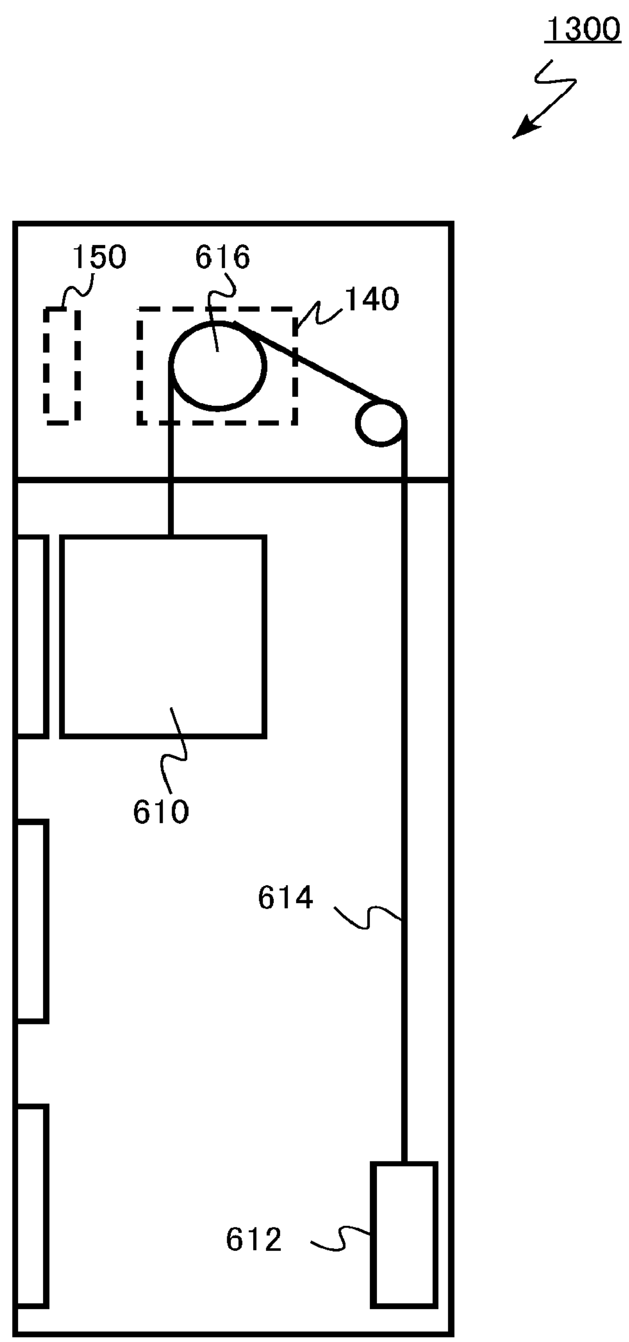
FIG. 23 is a schematic diagram of an elevator of the sixth embodiment.

FIG. 23 is a schematic diagram of an elevator of the sixth embodiment. An elevator 1300 of the sixth embodiment is provided with a car 610, a counterweight 612, a wire rope 614, a hoisting machine 616, a motor 140, and an inverter circuit 150.

The inverter circuit 150 is composed of three semiconductor modules using the MOSFET 100 of the first embodiment as a switching element. By connecting three semiconductor modules in parallel, a three-phase inverter circuit 150 provided with three AC voltage output terminals U, V, and W is realized.

AC voltage outputted from the inverter circuit 150 drives the motor 140. The hoisting machine 616 is rotated by the motor 140, so that the car 610 moves up and down.

With the sixth embodiment, the characteristics of the elevator 1300 are improved by providing the MOSFET 100 with improved characteristics.

Although a MOSFET is described as an example of a semiconductor device in the first and second embodiments, the present disclosure can also be applied to an insulated gate bipolar transistor (IGBT). An IGBT can be realized by replacing the region corresponding to the drain region 24 of the MOSFET from n type to p type.

Moreover, although a case where a semiconductor device of the first embodiment is provided is described as an example in the third to sixth embodiments, a semiconductor device of the second embodiment can also be applied.

Although a case where a semiconductor device of the present disclosure is applied to a vehicle or an elevator is described as an example in the third to sixth embodiments, a semiconductor device of the present disclosure can also be applied to, for example, a power conditioner or the like of a solar power generation system.

While certain embodiments have been described, these embodiments have been presented by way of example only, and are not intended to limit the scope of the inventions. Indeed, a semiconductor device, an inverter circuit, a driving device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a silicon carbide layer having a first plane and a second plane, the silicon carbide layer having an off angle of the first plane of no more than 8 degrees with respect to a (000-1) face;

a first electrode located on a side of the first plane of the silicon carbide layer;

a second electrode located on a side of the second plane of the silicon carbide layer;

a trench existing in the silicon carbide layer, the trench having a first side face, a second side face, and a bottom face between the first side face and the second side face;

a first silicon carbide region of a first conductivity type located in the silicon carbide layer and in contact with the first side face;

a second silicon carbide region of a second conductivity type located in the silicon carbide layer, the second silicon carbide region located between the first silicon carbide region and the first plane, and the second silicon carbide region being in contact with the first side face;

a third silicon carbide region of a second conductivity type located in the silicon carbide layer, the third silicon carbide region located between the first silicon carbide region and the first plane, the trench is located between the third silicon carbide region and the second silicon carbide region;

a fourth silicon carbide region of a first conductivity type located in the silicon carbide layer, the fourth silicon carbide region located between the second silicon carbide region and the first plane, and the fourth silicon carbide region being in contact with the first side face;

a fifth silicon carbide region of a first conductivity type located in the silicon carbide layer, and the fifth silicon carbide region located between the third silicon carbide region and the first plane, the trench is located between the fifth silicon carbide region and the fourth silicon carbide region;

a sixth silicon carbide region of a second conductivity type located in the silicon carbide layer and the sixth silicon carbide region being in contact with the second side face and the bottom face;

a gate electrode located between the first side face and the second side face; and a gate insulating layer located between the gate electrode and the second silicon carbide region, wherein the first side face has a first region that is in contact with the second silicon carbide region and has a first inclination angle with respect to the first plane, an off angle of the first region with respect to a {0-33-8} face is no more than 2 degrees, and a second inclination angle of the second side face with respect to the first plane is larger than the first inclination angle.

2. The semiconductor device according to claim 1, wherein the first inclination angle is no less than 56 degrees.

3. The semiconductor device according to claim 1, wherein the second inclination angle is no less than 80 degrees.

4. The semiconductor device according to claim 1, wherein the first region has an off angle of no more than 2 degrees with respect to a (0-33-8) face or a (−303-8) face.

5. The semiconductor device according to claim 1, wherein the first side face has a second region closer to the second plane than the first region, and a third inclination angle of the second region with respect to the first plane is larger than the first inclination angle.

6. The semiconductor device according to claim 1, further comprising a seventh silicon carbide region of a first conductivity type located in the silicon carbide layer, the seventh silicon carbide region located between the first silicon carbide region and the second plane, and the seventh silicon carbide region being in contact with the second plane, the seventh silicon carbide region having a first conductivity type impurity concentration higher than the first silicon carbide region.

7. An inverter circuit comprising the semiconductor device according to claim 1.

8. A driving device comprising the semiconductor device according to claim 1.

9. A vehicle comprising the semiconductor device according to claim 1.

10. An elevator comprising the semiconductor device according to claim 1.

* * * * *